United States Patent

MacRaild et al.

[11] Patent Number: 6,158,338
[45] Date of Patent: Dec. 12, 2000

[54] CASSETTE FOR HOLDING AND DISPENSING A VISCOUS MATERIAL FOR USE IN AN APPARATUS FOR DEPOSITING THE VISCOUS MATERIAL ON A SUBSTRATE

[75] Inventors: Neil M. MacRaild; Andrew C. Ricketts, both of Weymouth, United Kingdom

[73] Assignee: DEK Printing Machines Limited, United Kingdom

[21] Appl. No.: 09/218,679

[22] Filed: Dec. 22, 1998

[51] Int. Cl.$^7$ ...................................................... B05C 17/04
[52] U.S. Cl. .......................... 101/123; 101/366; 118/406; 222/330
[58] Field of Search ..................... 118/213, 301, 118/406, 323, 712; 222/330, 386; 427/96, 272, 282, 376.2; 101/119, 120, 123, 124, 129, 366

[56] References Cited

U.S. PATENT DOCUMENTS

| | | | |
|---|---|---|---|
| 3,384,931 | 5/1968 | Cochran et al. | 18/30 |
| 3,656,428 | 4/1972 | Duncan | 101/129 |
| 3,878,992 | 4/1975 | MacManus | 118/24 |
| 3,921,521 | 11/1975 | Kudlich | 101/120 |
| 3,994,220 | 11/1976 | Vertegaal . | |
| 4,022,355 | 5/1977 | Sabaka | 222/327 |
| 4,023,486 | 5/1977 | Linthicum et al. | 101/120 |
| 4,604,966 | 8/1986 | Kohn | 118/406 |
| 4,622,239 | 11/1986 | Schoenthaler et al. | 427/96 |
| 4,636,406 | 1/1987 | Leicht | 427/96 |
| 4,693,209 | 9/1987 | Leicht | 118/213 |
| 4,720,402 | 1/1988 | Wojcik | 427/282 |
| 4,961,955 | 10/1990 | Goldberg | 427/57 |
| 5,287,806 | 2/1994 | Nanzai | 101/123 |
| 5,309,837 | 5/1994 | Nanzai | 101/425 |
| 5,483,879 | 1/1996 | Tani et al. | 101/123 |
| 5,579,690 | 12/1996 | Tani et al. | 101/123 |
| 5,590,596 | 1/1997 | Tani et al. | 101/123 |
| 5,802,972 | 9/1998 | Hoffmann et al. | 101/170 |
| 5,806,423 | 9/1998 | Tani | 101/123 |
| 5,947,022 | 9/1999 | Freeman et al. | 101/123 |

FOREIGN PATENT DOCUMENTS

| | | |
|---|---|---|
| 0565151 | 10/1993 | European Pat. Off. . |
| 0626259 | 11/1994 | European Pat. Off. . |
| 0699482 | 3/1996 | European Pat. Off. . |
| 2250092 | 4/1974 | Germany . |
| 3115399 | 4/1982 | Germany . |
| 3150936 | 6/1983 | Germany . |
| 3226904 | 1/1984 | Germany . |
| 521175 | 5/1972 | Switzerland . |
| 547705 | 4/1974 | Switzerland . |
| 648497 | 3/1985 | Switzerland . |
| 1433957 | 4/1976 | United Kingdom . |
| 2257386 | 7/1995 | United Kingdom . |
| 2279899 | 7/1995 | United Kingdom . |
| 9620088 | 7/1996 | WIPO . |

OTHER PUBLICATIONS

Abstract, GB 2257386.

*Primary Examiner*—Ren Yan

[57] ABSTRACT

A cassette for holding and dispensing a viscous material for use in an apparatus for depositing the viscous material onto a substrate through openings formed in a stencil positioned over substrate. The cassette includes a body having a base and interior defined by first and second side walls and first and second end walls substantially orthoganol to the base. The base has a plurality of apertures formed therein, and a cover plate adapted to slide within the interior of the body. The cover plate having a plurality of protruding members wherein each of the protruding members corresponds to and is aligned with a corresponding one of the apertures of the base.

30 Claims, 27 Drawing Sheets

CASSETTE FOR HOLDING AND DISPENSING A VISCOUS MATERIAL FOR USE IN AN APPARATUS FOR DEPOSITING THE VISCOUS MATERIAL ON A SUBSTRATE

FIELD OF THE INVENTION

The present invention relates to an improved cassette for holding and dispensing a viscous material such as solder paste for use in an apparatus and to a method for carrying out the deposition of the viscous material on a substrate through the apertures of a stencil or screen. In particular, the improved cassette may be used in a screen printing machine for the deposition of solder paste on a printed circuit board.

BACKGROUND

As is known, a substrate such as a printed circuit board on which electronic components are placed requires that the components be soldered to the board. A viscous material, such as a non-conductive or conductive adhesive, solder paste or another silicon type viscous material is often deposited on the substrate before the component is placed on the substrate. Screen printing machines that are commercially available from a number of sources are used to automatically deposit the viscous materials through a mesh or metallic screen or stencil onto the substrate.

Generally, the solder pastes used in screen printing in the electronics industry are heterogeneous materials, the components of which have different densities, and are composed of metallic materials and organic or flux materials. The mass of the metallic portion of the solder paste represents approximately 85% to 90% of the total mass, with a density of 8 to 12 according to the metals used. It is understood that the term density means the weight as compared to 1 liter of water. In volume, the metallic portion represents only approximately 50% of the total volume. The organic material, also called flux, has a density of approximately 1.

The solder pastes described above are made up of metallic microspheres joined by the flux or organic material. This viscous flux comprises rheologic agents, adhesive agents and cleaning agents which affect the process of assembling components on printed circuit boards, The process, which is well known, involves:

deposition by screen printing of solder paste contacts onto selected portions of the substrate;

placing of component leads on the paste contacts, the adhesive agent of which holds the components to the board; and reflowing the solder paste in a furnace or oven, which causes the coalescence of the metallic microspheres, and, when cooled, results in the component being fixed on the board at the proper location.

The function of the alloy included in the solder paste is to provide the supply of metal necessary to ensure electrical interconnection between the leads of the components and the printed circuit by soldering. The organic materials in the paste must disappear at the conclusion of the soldering operation. Nevertheless, there is normally a residue of the organic materials which must be cleaned with water or with solvent, which is both costly and polluting.

Solder pastes reportedly resulting in a low residue have been developed. In these pastes, the organic part has substantially the same value in volume terms as in the previous pastes described above. Light solvents with low boiling points can be introduced to provide proper rheology or flow characteristics. Because of the low boiling points, these solvents become volatile more rapidly during a pre-heating step, which generally precedes the reflow step described above during the assembly of components onto printed circuit boards. At the end of the reflow step there thus remains little residue. In order to provide a satisfactory adhesive capacity, the light solvents described above are combined with adhesive resins, which become volatile or sublimate in the reflow step.

In addition, in these low residue solder pastes, the cleaning agents used for preparation of a surface which is suitable for producing satisfactory inter-metal connections occupy a very small part of the total volume of the paste. As the overall efficiency of the cleaning must not change, the volume efficiency of the active cleaning constituent has to increase in equal proportion to the decrease in residue.

These developments in low residue solder pastes result, on the one hand, in a greater dilution of the active cleaning constituents in the paste and, on the other hand, in a greater volatility of the additional solvents used. It is therefore necessary that an extremely homogeneous distribution of the active cleaning constituent be obtained within the volume of each deposit of solder paste when the solder paste is applied to the substrate. If this is not achieved, deposits of the solder paste will be obtained in which the efficiency of cleaning, for example, will not be identical for adjacent areas. Certain areas will have too much cleaning constituent applied, resulting in cleaning and residue problems. Other areas will not have sufficient cleaning constituents, and therefore the soldering obtained will be of poor quality.

The high degree of solvency and solubility of the additional solvents used in the low residue solder pastes results in the evaporation thereof while printed circuit boards are produced. In prior art modes of deposition, the material is dragged by means of an inclined wiper (see the prior art system shown in FIG. 1 and described below) in the open air and therefore the evaporation problem is not solved. The evaporation results in a change in the rheology of the solder paste during production. In extreme cases, the solder paste may become too dry and no longer pass properly through the apertures in the stencil.

These problems are exacerbated when production requirements necessitate high-speed screen printing, for example at 200 millimetres per second as opposed to 20 to 50 millimetres per second. To counteract these problems, thixotropic additives are introduced and combined with the other solvents. Evaporation of the base solvents therefore modifies the possible speed of deposition. By way of example, an evaporation of 1% from the volume of solder paste completely changes the rheology and makes screen printing very difficult, if not impossible.

Another of the problems caused by the known technology is the control of the wear and tear on the wiper system. Progressive erosion of the active edge of the wiper by rubbing alters the intrinsic qualities of the paste applied, and that of the depositions, because of the uncontrolled and random retrieval of a certain quantity of microspheres of the metallic portion of the solder with each wipe. In fact, the wipers are normally only changed when the poor quality of the deposition is a noticeable consequence of their wear.

In the prior art, two types of wipers have been commonly used. The first type of wiper is a rubber or polyurethane type. The hardness of this type of wiper varies generally between 70 to 90 Shore. This wiper has the advantage of good deformation by virtue of its low degree of hardness and its flexibility, and therefore good sealing is produced. It has the inconvenience of deforming during passage over the apertures in the stencil. For apertures where the dimension parallel to the wiper is less than 0.5 mm, this is not a major problem. However, where the apertures have dimensions parallel to the wiper greater than this value, the deposit is hollowed out. Where deposits are larger than 3 mm, they are completely dragged off again.

The second type of wiper is a metallic type. The advantage of this type of wiper is its ability to maintain rigidity and therefore not allow the deposit to be hollowed out. The hardness of this type of wiper, however, despite its flexibility, does not allow for perfect sealing with the stencil. The hardness of the metallic wiper sometimes exceeds that of the stencil and therefore often scratches the stencil resulting in encrustation of solder microspheres. The excessive pressure of the metallic wiper can also cause crushing of the tinlead spheres, this alloy being much softer than the steel wiper.

FIG. 1 shows a prior art implementation for depositing a viscous material onto a substrate 1 through a stencil or a screen 2 provided with apertures or openings 3, by means of a wiper 4. The material to be deposited is labeled 5.

In FIG. 1, standard wiper 4, inclined at an angle which can vary from 60° to 45° with respect to the substrate 1, fulfils at least two functions at the same time. First, it drags the material to be deposited over the stencil (in FIG. 1, with a force in the direction of the arrow 4A). Second, it transfers the material through the apertures or openings 3 in the stencil or screen 2 (in FIG. 1, with a force in the direction of the arrow 4B).

The force of transfer, however, can only be exerted if there is displacement of the wiper 4. Furthermore, this force is not constant over the whole length of the wiper 4, but rather is at its maximum at the ends of the wiper 4 and decreases along the length thereof Because of this differential in force, the result of the transfer is directly linked to the viscosity of the material (which changes quickly), the force of transfer resulting from the sloping of the wiper 4, and from the movement of the wiper 4.

At the point of contact between the wiper 4 and the stencil 2, the wiper 4 fulfils three functions: (1) sealing between the stencil and the wiper; (2) wiping the stencil 2, which allows removal of the surplus material; and (3) contact between the stencil 2 and the substrate 1, there being no contact downstream and upstream of the wiper 4.

The fact that a single wiper 4 fulfills all of these functions makes independent action with respect to each of these functions impossible within the prior art technology. Moreover, the prior art technology has several disadvantages. Referring to FIG. 1, the material to be distributed through the apertures 3 is always downstream of the wiper 4. As a result, as shown in FIG. 1, when the filling of the aperture 3 takes place, it is always in a zone where the stencil 2 is not in contact with the substrate 1. Therefore, the material can be pushed in between the stencil 2 and the substrate 1 (designated as item 5A in FIG. 1), making on the one hand undesirable lines on the substrate 1, and on the other hand fouling the stencil 2, which must be cleaned frequently. In addition, because the material is dragged by means of the wiper 4 in the open air, evaporation of the constituent parts of the material may occur.

Moreover, the transfer efficiency of a system can be simply characterized by the following coefficient, K:

$$K = \frac{T \times P}{V},$$

wherein T is the contact time, P is the pressure applied to the material being transferred, and V is the viscosity of the material being transferred. With prior art squeegee printing described above, transfer efficiency cannot be controlled because all of the factors, T, P and V are variable.

WO 96/20088 filed by the Ford Motor Company relates to a method and an apparatus for distributing a viscous material by compression thereof through the apertures of a stencil. The apparatus comprises a reservoir receiving a charge of viscous material; a pressure is exerted on the viscous material in the reservoir. The reservoir is linked via a conduit to a distribution nozzle or compression head having a conical internal shape with baffle plates. The distribution nozzle is provided with a rectangular distribution slit delimited by two wipers disposed in opposite directions, slightly inclined with respect to the vertical. The two wipers bear against the stencil and keep it in contact with the substrate in the zone between them. The aim of this apparatus is to allow implementation of high-speed screen printing.

It appears that the technology disclosed by WO 96/20088 not only does not permit the resolution of the problems described previously, but moreover accentuates them. Indeed, the viscous material has to be placed in a reservoir which is an integral part of the system. The viscous material must, following the reservoir, be pushed under pressure towards the nozzle. The system according to WO 96/20088 has disadvantages, in particular with regard to the cleaning of the conduit from the reservoir to the nozzle. Further, the conical internal shape of the nozzle and the baffle plates with which it is provided, in theory provided to guide and equalize the pressure, will have the effect of laminating the paste. Such an effect is hardly compatible with the heterogeneous nature of the paste and the difference in density of the metallic parts and the flux. Furthermore, this laminating creates a significant risk of separating the components of the paste and thus results in deposits of unequal quality. In addition, according to WO 96/20088, the nozzle and wipers bear upon the stencil either under the effect of a pressure independent of the pressure applied to the material in the nozzle or under the effect of springs acting on the wipers.

SUMMARY OF THE INVENTION

According to an aspect of the present invention, a cassette for holding and dispensing a viscous material for use in an apparatus for depositing the viscous material onto a substrate through openings formed in a stencil positioned over the substrate is described. The cassette includes a body having a base and an interior defined by first and second side walls and first and second end walls substantially orthoganol to the base, the base having a plurality of apertures formed therein. The cassette also includes a cover plate adapted to slide within the interior of the body, the cover plate having a plurality of protruding members, wherein each of the protruding members corresponds to and is aligned with a corresponding one of the apertures.

According to a further aspect of the present invention, described is an apparatus for depositing a viscous material on a substrate through the apertures of a stencil which utilizes the above-described cassette. The apparatus includes a transfer head having a plurality of apertures on a top side thereof, a carrier unit adapted to receive the cassette, first and second wipers attached to a bottom side of the transfer head, and a piston crosshead for applying a pressure to the cover plate of the cassette. The carrier unit is affixed to the transfer head by a hinge such that the carrier unit is movable between an open position and a closed position. When the cassette is loaded into the carrier unit and when the carrier unit is in the closed position, the apertures of the cassette are aligned with the apertures of the transfer head. Thus, in one embodiment of the present invention, when the piston crosshead applies a pressure to the cover plate, the viscous material is pushed through the apertures of the base of the cassette and the apertures of the transfer head. Furthermore, when the apparatus is displaced along the stencil, an excess amount on the viscous material left on the stencil is detached and lifted by the first wiper and rolled in an area delimited by the first and second wipers. In addition, when the excess amount of the viscous material is detached and lifted and rolled, the excess amount of the viscous material is pushed up through a grid attached to the bottom side of the transfer head.

According to a further aspect of the present invention, a method for depositing a viscous material on a substrate through the apertures of a stencil includes providing a transfer head having a plurality of apertures on a top side thereof and having first and second wipers attached to a bottom side thereof, and inserting a cassette for holding the viscous material as described above into a carrier unit affixed to the transfer head and adapted to receive the cassette, the carrier unit being movable between an open position and a closed position. The method further includes moving the carrier unit to the closed position where in the apertures of the base of the cassette are aligned with the apertures of the transfer head, moving the transfer head to a position wherein the wipers contact the stencil, applying a downward print pressure to the transfer head in a first direction substantially perpendicular to a top surface of the stencil, the downward print pressure pushing the wipers against the stencil, applying a downward paste pressure to the cover plate of the cassette in the first direction, the paste pressure pushing the viscous material through the apertures in the base of the cassette and in the top side of the transfer head and against the wipers, and moving the transfer head in a second direction substantially parallel to the top surface of the stencil. In a further embodiment, the transfer head further comprises a grid having a plurality of apertures attached to the bottom side of the transfer head and the moving step further comprises detaching and lifting an excess amount of the viscous material left on the stencil and rolling the excess amount of material in an area delimited by the first and second wipers.

According to still a further aspect of the present invention, described is an apparatus for depositing a viscous material onto a substrate through openings formed in a stencil positioned over the substrate. The apparatus includes a receptacle having a top and a bottom, and first and second longitudinal sides opposite one another, the bottom having a plurality of apertures, and an intermediate receptacle containing the material inserted inside the receptacle. The intermediate receptacle includes a body having a base and an interior defined by first and second side walls and first and second end walls substantially orthogonal to the base, the base having a plurality of apertures formed therein, and a cover plate adapted to slide within the interior of the body, the cover plate having a plurality of protruding members, wherein each of the protruding members corresponds to and is aligned with a corresponding one of the apertures of the base. The apparatus also includes a piston movable within the receptacle for applying a pressure to the cover plate to move the material toward the apertures of the base of the cassette and toward the apertures of the receptacle, and a first wiper attached to the bottom of the receptacle at the first longitudinal side and a second wiper attached to the bottom of the receptacle at the second longitudinal side, wherein the first and second wipers are inclined at an angle with respect to a plane that is parallel to the bottom of the receptacle.

BRIEF DESCRIPTION OF THE DRAWINGS

Further features and advantages of the invention will be apparent upon consideration of the following detailed description of the present invention taken in conjunction with the following drawings, in which like reference characters refer to like parts, and in which.

DETAILED DESCRIPTION

Figure 2:
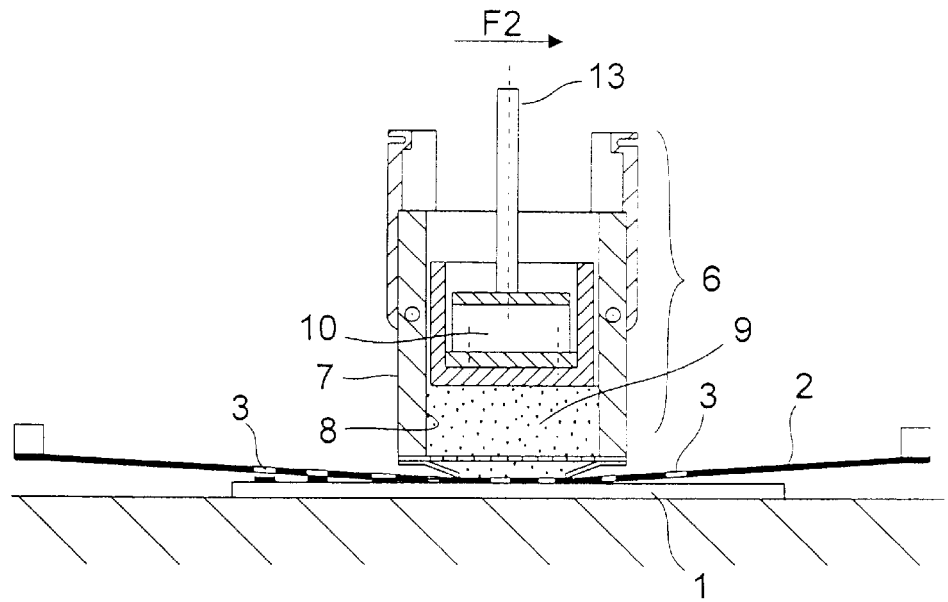
FIG. 2 is a view in transverse section of an apparatus for deposition of viscous material on a substrate.

In order to solve the above-described problems associated with prior art squeegee systems, the systems described in U.S. application Ser. Nos. 08/949,577 and 09/075,093 have been developed. FIG. 2 shows a view in transverse section of an embodiment of an apparatus disclosed in these applications; this view is complemented by FIG. 3 which is a view in partial transverse section, and by FIG. 4 which is a view in longitudinal section.

FIG. 2 shows the substrate or printed circuit board 1, resting on a table, with stencil or screen 2 placed thereon, the screen 2 having apertures or openings 3. Also shown in FIG. 2 is the distribution apparatus 6 for the material. The distribution apparatus 6 includes a receptacle or container 7, the internal wall or walls of which is or are rectilinear and parallel. In the internal cavity of the receptacle 7, the walls of which are vertical, a quantity of material, for example solder paste (labeled 9) is placed. The material may be placed within the container 7 in the factory.

A piston 10 is movably mounted in the internal cavity of the receptacle 7. The piston 10 has a head 11 (FIG. 3), the surface of which is planar. It is provided with vertical walls 12 behind its planar head, which slide on the vertical wall or walls of the receptacle 7 and contribute to the guiding of the piston 10. A vertical pressure is exerted on a rod 13 of the piston 10 (FIG. 2) according to the arrow F1 of FIG. 3. This vertical pressure is delivered to the rod 13 of the piston 10 by a pressure source (not shown) and a member of the screen printing machine capable of transmitting this pressure. The pressure exerted upon the material 9 is uniform and constant throughout the receptacle 7 due to the rectangular cross sectional shape of the receptacle 7 containing the material 9 and the piston 10.

Figure 3:
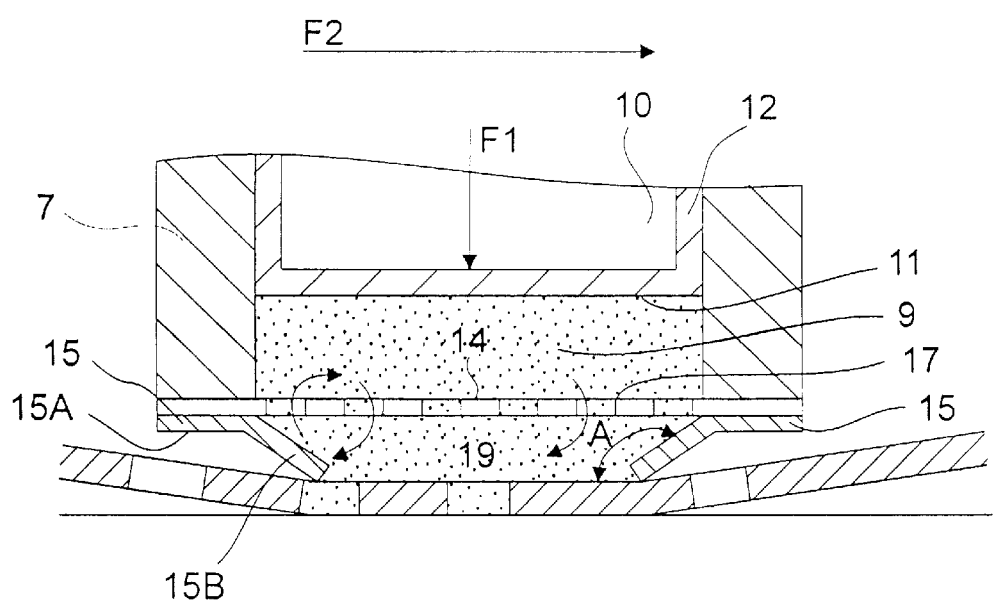
FIG. 3 is a view in transverse section of the apparatus shown in FIG. 2.
Figure 5:
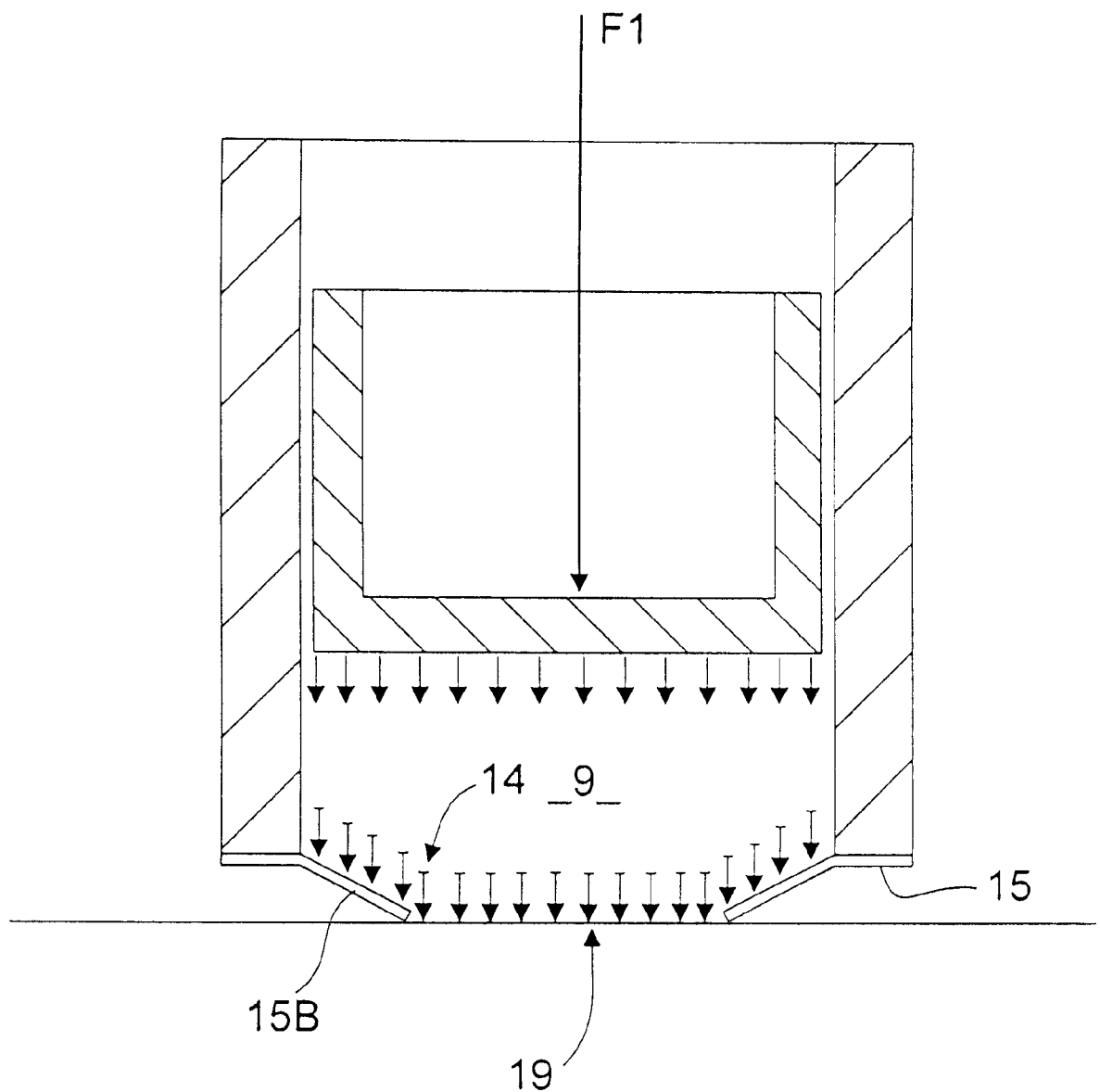
FIG. 5 shows, in a transverse section view, the pressures exerted within the apparatus shown in FIG. 2 and on the stencil and the substrate.
Figure 7:
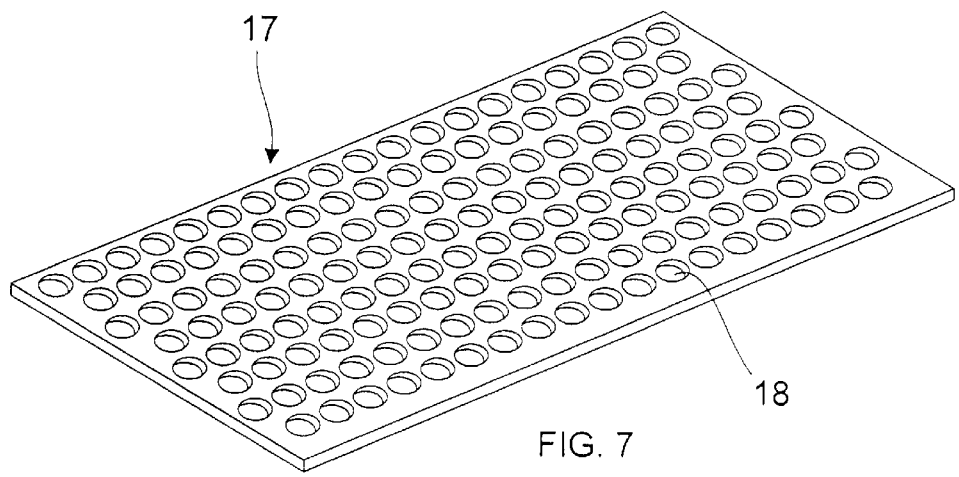
FIG. 7 is a perspective view of the grille shown in FIGS. 2–4, 6, 9 and 13.

Referring to FIGS. 3 and 5, the receptacle is open towards the bottom by means of a distribution aperture 14. Furthermore, sealing members 15 and 16 delimit or define an aperture 19. At the base of the receptacle 7 there is attached a member 17 for homogenization or mixing of the material by dividing the heterogeneous paste-like or viscous material. This member 17 is constituted by a perforated grille or by a perforated wall, the perforations of which are, as shown in FIG. 7, preferably all of the same size and made according to a constant spacing and pitch. The perforations 18 of the grille 17 in FIG. 7 are circular, but may be of other configurations. The grille 17 fulfils both a function of holding the solder paste or other material in the cavity of the receptacle 7 and also transmits the material onto the stencil 2 as the material is pushed by the piston 10. As the material is pushed by the piston 10, the material also exerts a downward pressure on the grille 17 resulting in a downward pressure on the sealing members 15 (described below).

Figures 8A, 8B:
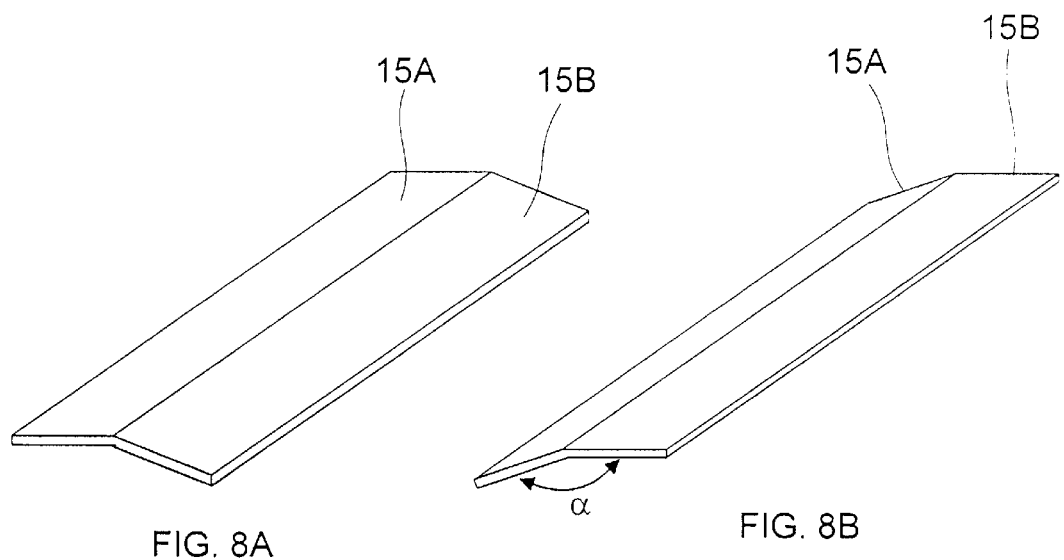
FIGS. 8A and 8B are perspective views at different angles of the wipers shown in FIGS. 2, 3, 5, 6, 9, 12, and 13.

Below the grille 17 there are arranged the sealing members 15 and 16 which delimit or define the aperture 19 (FIG. 3) for delivering the material 9. The aperture 19 is of a smaller dimension than the receptacle 7 as shown in FIG. 3. The sealing or wiping members 15 are shown in FIGS. 2 and 3, and by themselves in FIGS. 8A and 8B. The sealing members 16 are shown in FIG. 4, which is a view in longitudinal axial section of the apparatus 6.

The sealing members 15, alternatively referred to herein as wipers, are fixed by a part 15A to the walls of the receptacle 7 (FIG. 3), and thus are also fixed to the grille 17, which is also fixed to the walls of the receptacle 7. The wipers 15 also include a part 15B (FIGS. 3 and 5) which is disposed at an angle relative to the lower section of the receptacle 7 and to the direction of descent of the material 9 under the pressure of the piston 10. The wipers 15 are mounted opposite one another, their inclined parts 15B facing one another and in opposite directions. As shown in FIG. 3, the angle of inclination A of parts 15B with respect to the horizontal in the zone of distribution of the material 9 onto the stencil 2 is greater than vertical, and can, for example, be between 120° and 180°. In the case in which parts 15B are inclined at 180°, its extremity can be beveled or inclined. The above described broad angle of inclination is important because it allows the material 9 to push down on the part 15B of the wiper 15 and push it against the stencil 2. The angle formed by parts 15B with respect to the horizontal outside of the zone where the material 9 is deposited is the complement of the value A, i.e., is 180°.

The wipers 15 can be of any suitable metal or synthetic material. However, they are preferably made of a hard, flexible material which is sufficiently deformable without exceeding the elastic limit of the material. Advantageously, wipers 15 such as described are arranged on the long longitudinal sides of the apparatus 6 and approach the stencil 2 and the substrate 1 transversally. Each wiper 15 has the function of lifting, by detachment, the excess material remaining on the stencil 2. This functioning is more efficient than in the prior art wiping apparatus (FIG. 1) in which the material is pushed by the wiper 4.

Figure 4:
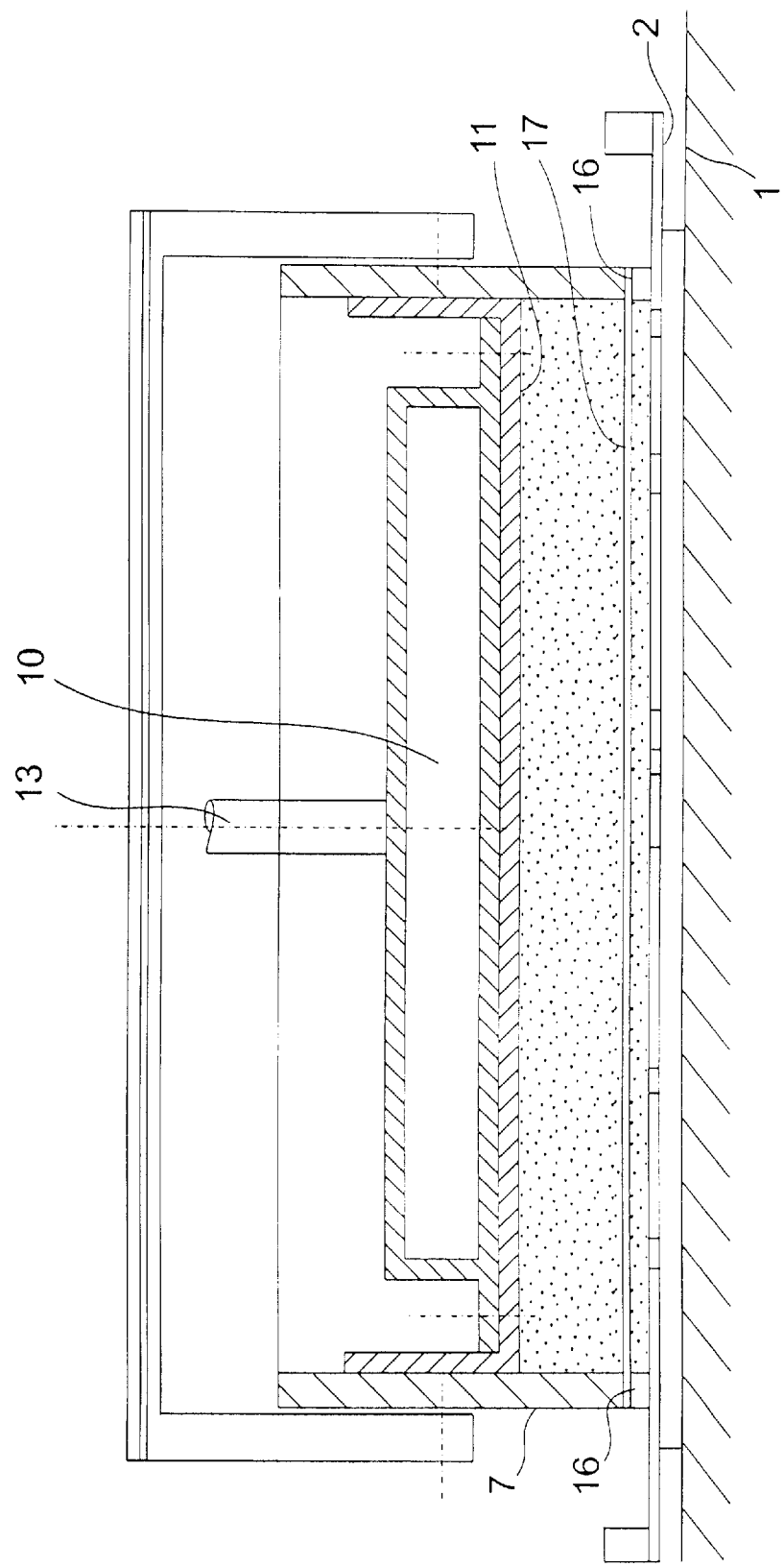
FIG. 4 is a view in longitudinal section of the apparatus shown in FIG. 2.

In one embodiment of the apparatus, the transverse or short sides of the apparatus 6, which has the shape of a rectangular parallelepiped, can either be provided with wipers 15 providing sealing as described previously, or may be provided with sealing members 16 such as are shown in FIG. 4. Sealing members 16 can be a contoured section of a flexible material, or an elastically deformable contoured section which can, for example, be constituted by a contoured section which is hollow or made from closed cell foam. The function of the members 16 is that of lateral sealing, thus avoiding overflow of the material outside of the area delimited thereby.

In an alternate embodiment, the apparatus 6 of the present invention is provided with only one wiper 15 on a longitudinal side thereof, and with sealing members 16 on the other three sides thereof. In this case, the apparatus 6 could only function in one direction.

The piston 10 exerts a pressure (according to the arrow F1 in FIG. 3) on the paste like and/or viscous material 9. Together with this pressure, a displacement movement in the direction of the arrow F2 (FIG. 2), or in the direction opposite to the arrow F2, is provided to the apparatus 6 to allow it to cover the surface of the stencil 2 and of the substrate 1. The vertical pressure of the piston 10 in the receptacle 7 pushes the material 9 through the grille 17 and through the lower aperture 19 towards the stencil 2 and the substrate 1. At the same time, the vertical pressure pushes the material 9 onto the wipers 15, which contributes to keeping the portions 15B of the sealing or wiper members under pressure and also contributes to wiping off the excess material 9 by simultaneous displacement of the apparatus 6. As shown in FIG. 5, because the material 9 is pushed both against the wipers 15 and the stencil 2, a perfect contact between the stencil 2 and the substrate 1 is achieved.

The inclination of the parts 15B of wipers 15 as defined hereinabove contributes to detaching and lifting the excess material which remains in the zone delimited or defined by the grille 17 and the parts 15B of the wipers 15. As the wipers 15 are arranged in opposite directions relative to one another, this wiping function is performed regardless of the direction of displacement of the apparatus 6.

The grille 17 functions as a homogenizing or mixing element for the material 9, for example solder paste. In particular, the paste is divided as it is pushed downward due to the fact that the solder paste leaves the grille 17 in separate strings or small rods, corresponding to each of the perforations in the grille 17. The strings or rods are then re-agglomerated by rubbing on the stencil or screen 2. The open surface of the grille can be between 20% to 90% of the total surface thereof In addition, the grille 17 can be removable and/or interchangeable according, for example, to the proportion of open surface which is desired.

The lower aperture 19 can be of dimensions adapted according to the desired speed of application of the material 9 and/or of the viscosity of the material 9 to be deposited. The apparatus is applicable to the application of very high viscosity materials as well as to very low viscosity materials. The aperture 19 can be so adapted by varying its width, meaning the distance between the parts 15B of the wipers 15. It is also possible to envisage that the width of the receptacle 7 and of the piston 10 is different and more or less larger than the aperture 19 and that the relationship therebetween is adapted according to the particular rheology of the material 9. The length of the apparatus 6 and the length of the aperture 19 can be adjusted to cover the whole of the width of the substrate 1 and/or of the stencil 2 or of the zone of the stencil 2 on which the deposits are to be made.

Figure 6:
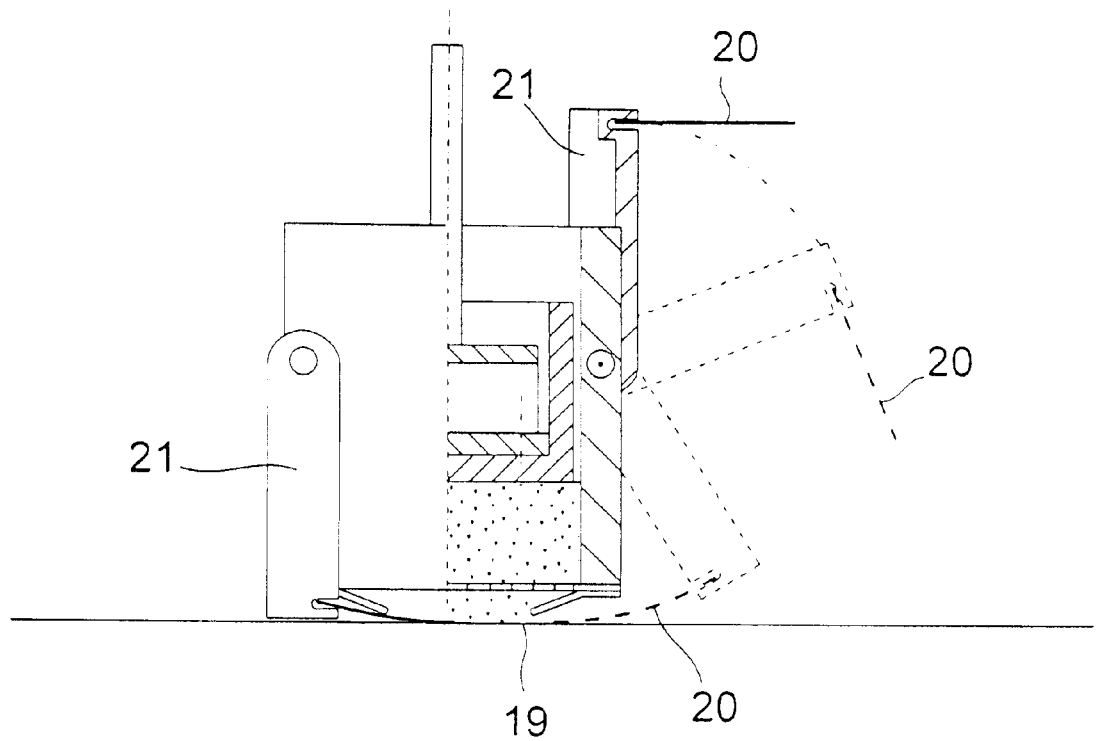
FIG. 6 shows a manner of engagement between the apparatus of FIGS. 2, 3, 4, 5, 10, and 12 and the stencil so that they may be separated from one another.

In another embodiment of the apparatus, removal of the apparatus 6 from the stencil 2 and/or substrate 1 without spilling the material 9 is possible by interposing a wall between the wipers 15 and the material 9 on the one hand, and the stencil 2 on the other hand. Advantageously, as shown in FIG. 6, the receptacle 7 is provided with at least one wall 20. This wall 20 is carried by any suitable member which allows it to be positioned outside the field of the aperture 19, or below it. Preferably, this wall 20 is a flexible, rigid or semi-rigid wall acting as a blade. In the embodiment shown in FIG. 6, the wall 20 is carried by an articulated and moveable flap 21 in order to occupy the positions such as shown in broken lines. Preferably, the flap 21 is articulated on the external face of the receptacle 7, and is placed in the upper position during the phase of displacement of the apparatus 6. When it is desired to remove the apparatus 6 from the stencil 2, the flap 21 is articulated to the lower position such that it covers aperture 19 and prevents material 9 from exiting therefrom. In an alternate embodiment, the apparatus 6 comprises two walls 20 and two flaps 21 articulated on each of its external front and rear faces.

Figure 9:
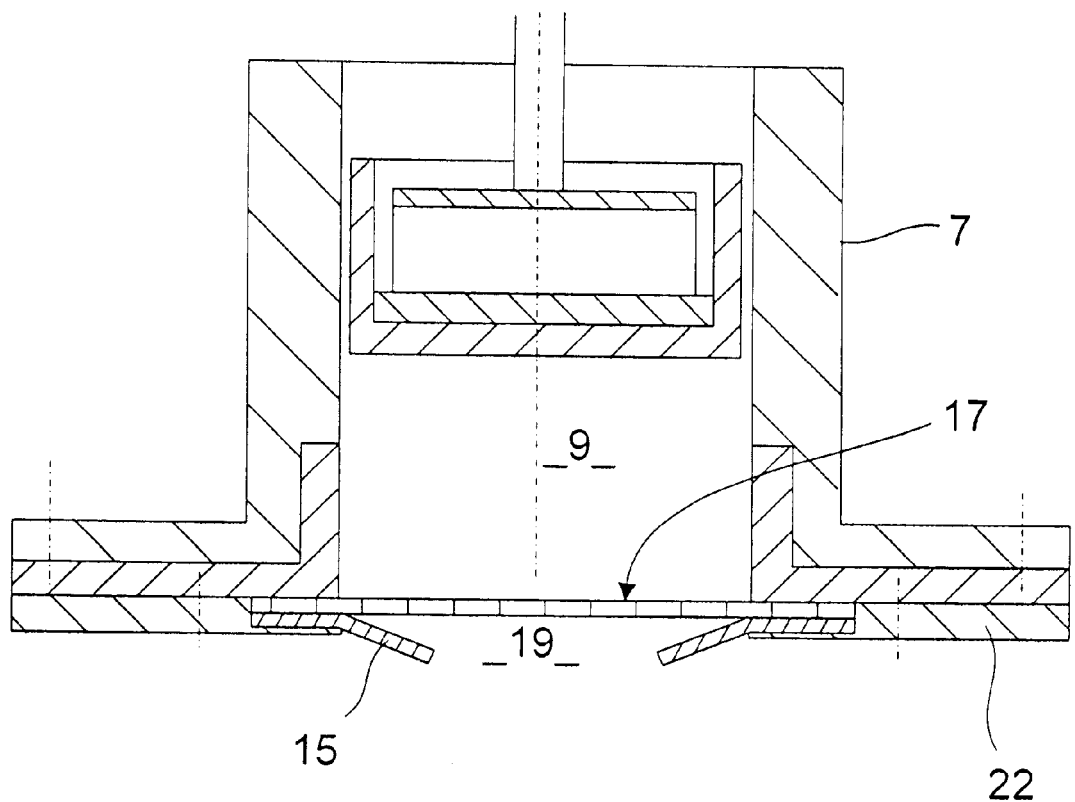
FIG. 9 shows a view in transverse section of another embodiment of an apparatus for deposition of a viscous material on a substrate.

FIG. 9 shows a view in transversal section of an embodiment of the apparatus 6 in which the grille 17 and the wiper or wipers 15 are carried by an apparatus 22 which can be fixed, such that it can be dismantled, below the receptacle 7. This embodiment allows the mounting and dismantling of the grille 17 and or the wiper or wipers 15 and the changing of one or the other of the grille 17 and the wipers 15.

The distribution apparatus 6 is designed to function in a sealed manner by contact with the stencil 2 which pushes against the substrate 1. This sealing allows materials which are sensitive to humidity, for example, silicones, to be used without prolonged exposure to air. Furthermore, the aperture 19 can be covered over by a cover (not shown) prior to use of the apparatus 6, which can be glued below the grille 17 and which can be peeled or torn off, which also prevents the material form being exposed to air for prolonged periods.

Figure 10:
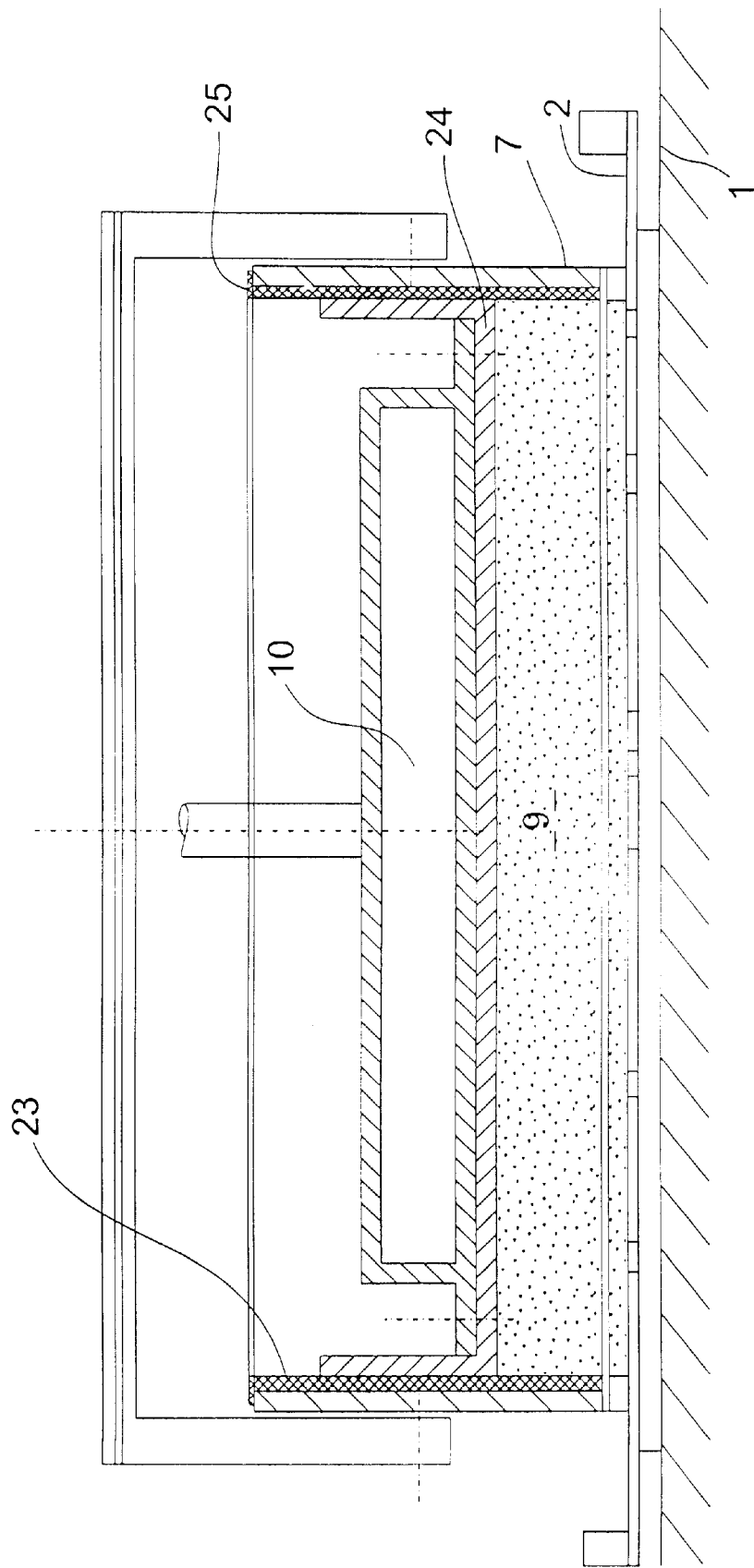
FIG. 10 is a view in longitudinal section of an apparatus for deposition of a viscous material on a substrate with an intermediate receptacle or cassette.

FIG. 10 shows a view in longitudinal section of an embodiment of the apparatus for deposition of paste-like or viscous material with an intermediate receptacle or cassette 23. The material 9 is contained in an intermediate receptacle or cassette 23 which is closed at the top with a sliding cover 24 (FIG. 11) and which is introduced into the cavity of the receptacle 7. The piston 10 pushes the material in this intermediate receptacle or cassette 23 by bearing on the sliding cover 24 pushing the cover down, thus pushing the material down. The intermediate receptacle or cassette 23 may be filled with a quantity of material 9 at the factory directly by the material manufacturer.

Figure 11:
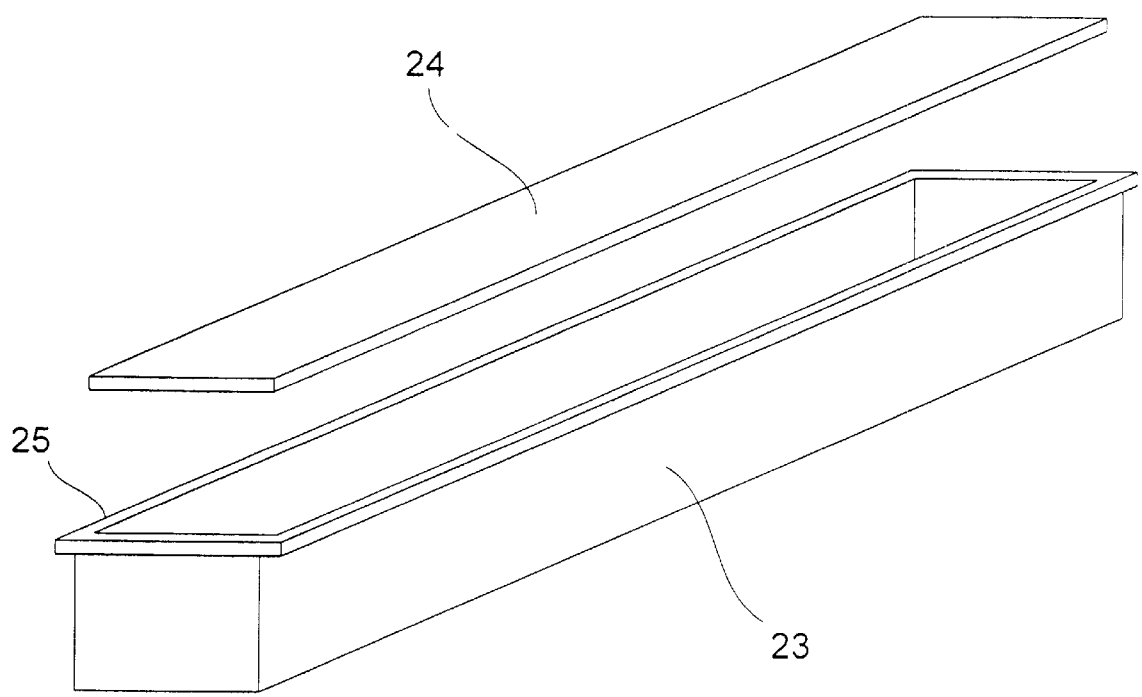
FIG. 11 is a perspective view of the intermediate receptacle or cassette of FIG. 10 with its cover.
Figure 12:
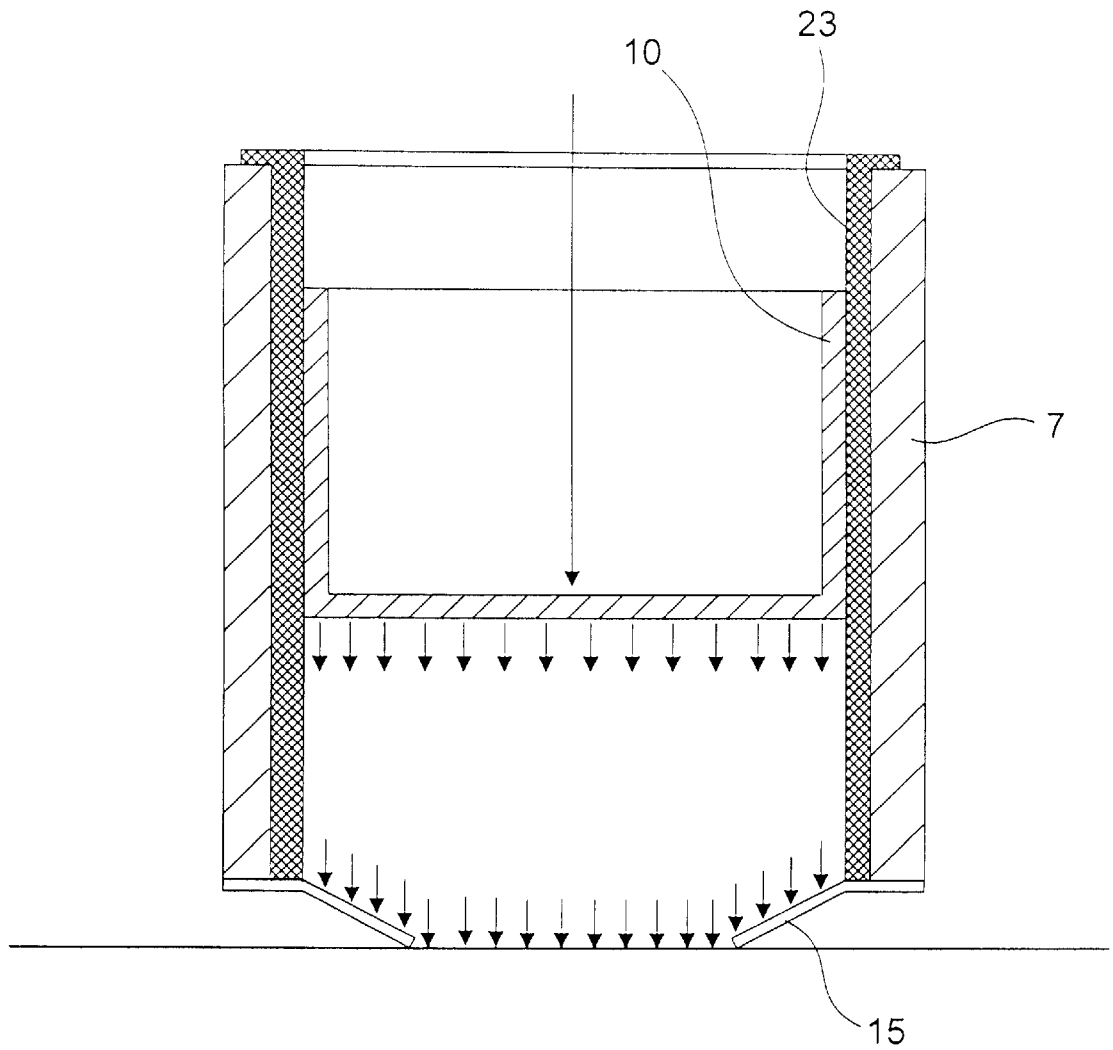
FIG. 12 is a view in transverse section of the apparatus according to FIG. 10.

The intermediate receptacle or cassette 23 is shown in FIG. 11 and has a shape corresponding to that of the internal cavity of the receptacle 7. The intermediate receptacle or cassette 23 has vertical walls and an aperture at the top and at the bottom. These apertures can be covered in the factory after filling by any known means and uncovered at the time of installation of the intermediate receptacle or cassette 23 in the receptacle 7.

Preferably, the intermediate receptacle or cassette 23 is provided with a shoulder 25, totally or partially peripheral, on its top edge for anchoring the intermediate receptacle or cassette 23 to the receptacle 7. The intermediate receptacle or cassette 23 preferably has smooth and rectilinear internal walls. The intermediate receptacle or cassette 23 is designed as a disposable or recyclable cartridge. The cover 24 rests on the paste-like material and, as shown in FIG. 11, is a planar plate with dimensions slightly smaller than the top aperture of the intermediate receptacle or cassette 23 so that it can slide in the intermediate receptacle or cassette 23 under the pressure of the piston 10 which pushes the material 9.

One advantage of this improvement is that it simplifies and makes less expensive the manufacture of the apparatus 6. Another advantage is that it facilitates the handling of the paste-like or viscous material and/or its mixing or heating prior to use. In particular, it eliminates the need to manually handle the material and load it into the apparatus 6.

Figure 13:
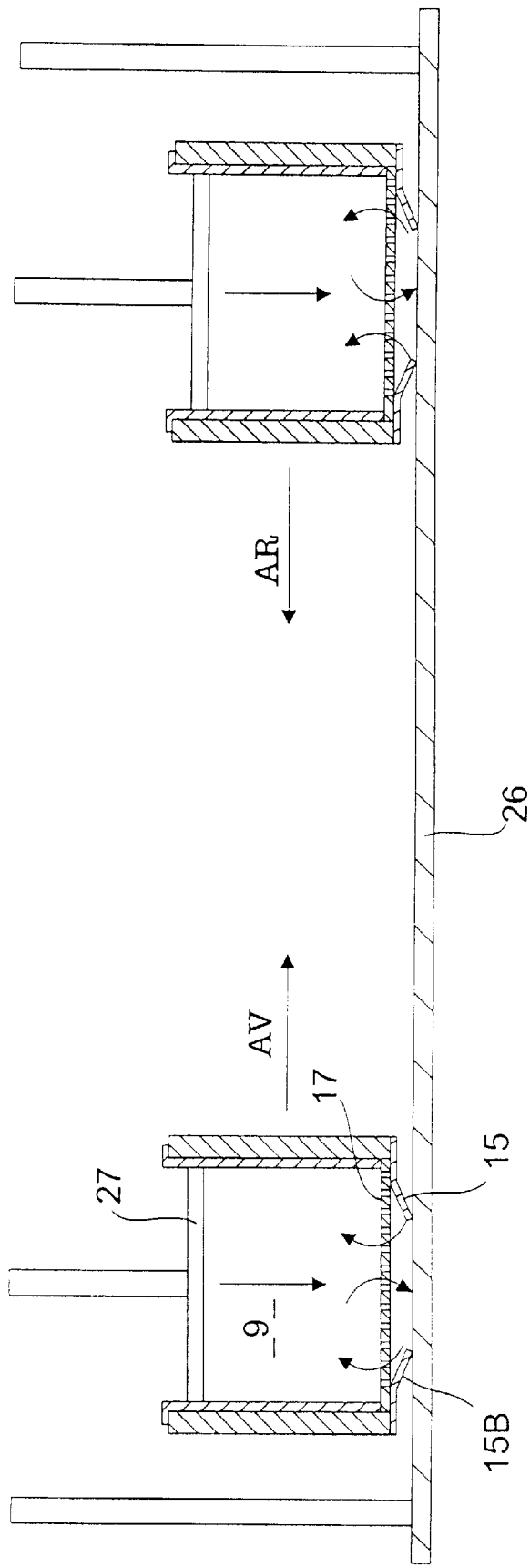
FIG. 13 is a view in transverse section of an apparatus for mixing a viscous material.

The intermediate receptacle or cassette 23 can also integrate functions of the apparatus 6 which receives it. In particular, as shown in FIG. 13, intermediate receptacle or cassette 23 can be provided at the level of the lower aperture thereof with an openwork grille 17 and its lower aperture can be delimited or defined by sealing members 15, the parts 15B of which are in opposite directions. This construction facilitates production because the grille 17 and the sealing members 15 can be molded with the intermediate receptacle or cassette 23.

FIG. 13 shows a material mixing apparatus which can be used in conjunction with the intermediate receptacle or cassette 23 before insertion in the receptacle 7 of the apparatus 6. It comprises a planar, preferably rigid, plate 26 under the aperture delimited by the sealing members 15, which is substituted for the stencil 2. The apparatus 6 is guided, for example, by means of a rail (not shown) or any other mechanical means, parallel to the plate 26. A pressure is exerted by a piston 27, which can be of the same type as the piston 10, and which bears upon the material 9 and passes it through the grille 17.

The forward movement, that is to say from left to right in FIG. 13, causes the setting in motion and the rotation of the paste and its agitation and its homogenization at the time of passage through the apertures of the grille 17 in the clockwise direction. The backward movement, that is to say from right to left in FIG. 13, causes the setting in motion, the rotation and the homogenization of the paste in the opposite direction. Several forward-backward movements provide mixing of the solder paste, the wipers 15 lifting the paste as shown by the rotational arrows in FIG. 13, so that the paste passes upward through the grille 17 and is pushed back downward through the grille 17 by the piston 27. This action gives the paste the rheological qualities suitable for its application from the start of its use, whether for new cartridges or for cartridges which still contain some material and which have to be re-used after a downtime. It will of course be appreciated that this rotation and homogenization of the material 9, which is important to maintain the proper rheology of the paste, also occurs during displacement of the apparatus 6 during a printing operation as is shown by the rotational arrows in FIG. 3.

Furthermore, the apparatus 6 does not require high working pressures. As it is designed as a sealed container, the apparatus 6 eliminates the cleaning operations that were necessary in connection with the prior art. Moreover, the apparatus 6 is healthier and safer to use because users do not have to come into direct contact with material 9.

According to the criteria of application and/or the nature of the materials to be deposited, the distribution apparatus 6 can be insulated and/or provided with a thermostat, heated or cooled, without it being necessary to provide this insulation or conditioning for the whole machine, as was the case with the prior art.

Figure 14:
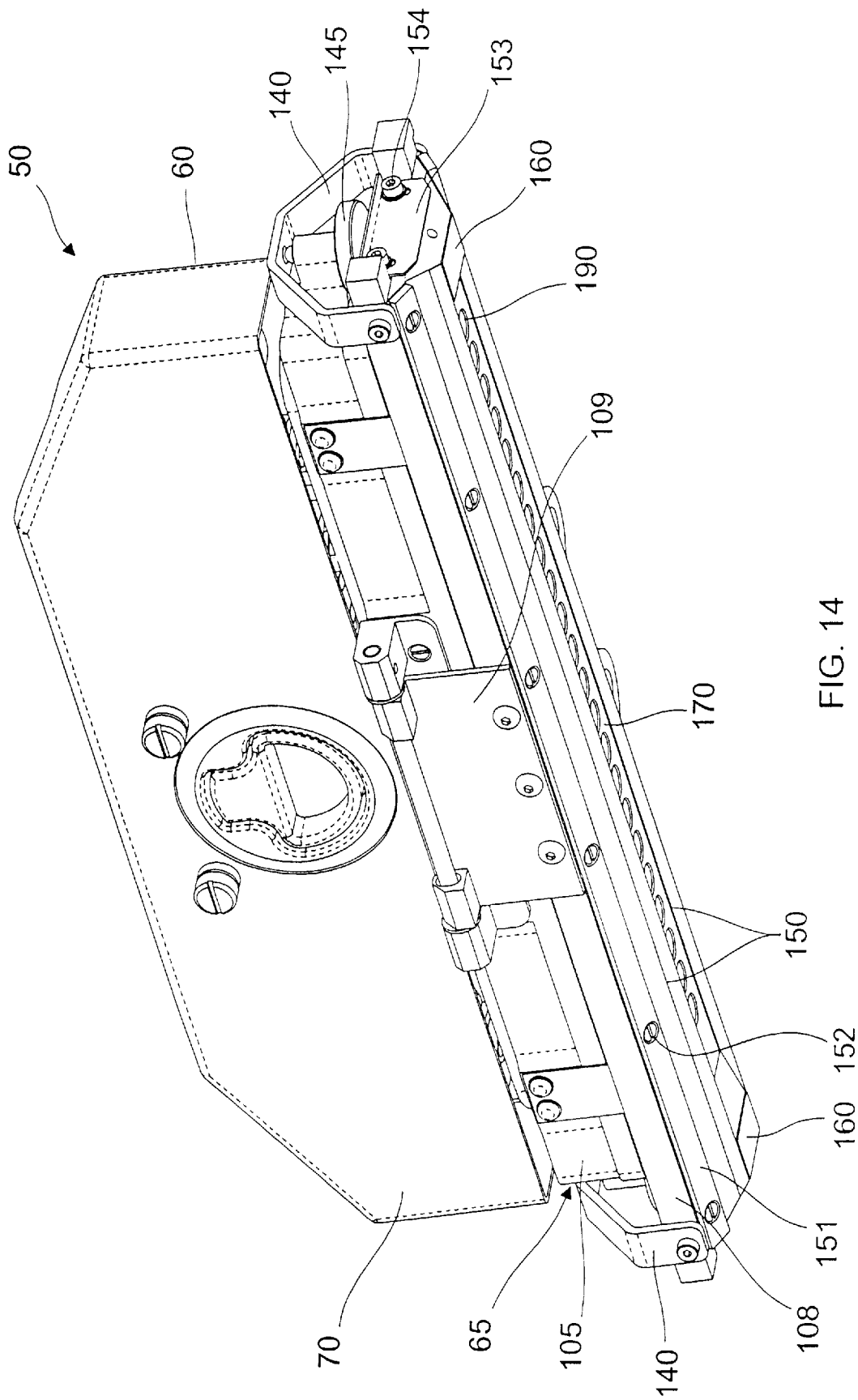
FIG. 14 is a perspective view of a further embodiment of an apparatus for the deposition of a paste-like or viscous material on a substrate where the apparatus is shown in the closed position.
Figure 15:
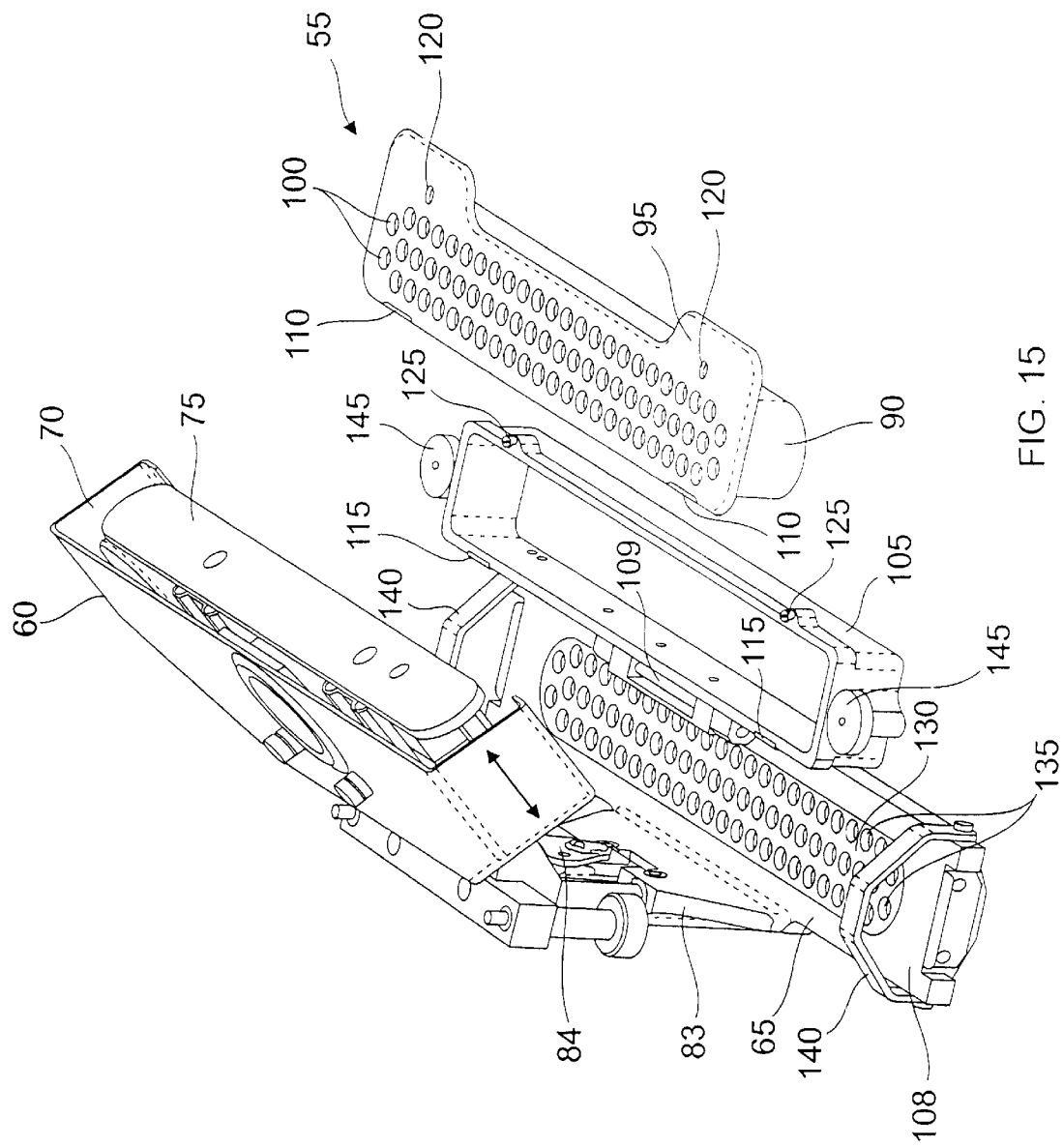
FIGS. 15 through 18 are perspective views of the apparatus shown in FIG. 14, where the apparatus is in the open position.

Referring to FIGS. 14 through 18, an apparatus 50 described in the above-referenced U.S. applications for carrying out the deposition of a viscous material, such as solder paste, on a substrate, such as a printed circuit board, through the apertures of a stencil or screen is shown. The apparatus 50 is commercially available from DEK Printing Machines, Ltd., 11 Albany Road, Granby Industrial Estate, Weymouth, Dorset, England for use with screen printing machines under the designation "ProFlow head", and the structure of the DEK ProFlow head is incorporated herein in its entirety by reference. An embodiment of a paste cassette 55 for use in connection with the apparatus 50 is shown in FIG. 15 and is described in more detail below. The paste cassette 55 is also commercially available from DEK Printing Machines Ltd. and is manufactured by Multicore Solders Ltd., Wood Lane End, Hemel Hempstead, Hertfordshire, England. This Multicore cassette, the structure of which is also incorporated in its entirety herein by reference, is designated by Multicore as the Multicore DISC and is the subject of UK patent application no. 9712047. 1, filed on Jun. 10, 1997.

Although the apparatus 50 is generally applicable to the application of any viscous material to the surface of any substrate, for illustration purposes the description provided herein will be directed to the application of solder paste to the surface of a printed circuit board.

FIG. 14 is a perspective view of the screen printing apparatus 50 wherein the apparatus 50 is in the closed position. FIGS. 15 through 18 are perspective views of the apparatus 50 in the open position which illustrate the steps of loading the paste cassette 55 into the apparatus 50. The apparatus 50 can be used in connection with existing screen printing machines sold by DEK Printing Machines Ltd., including the DEK Model 265 screen printing machine. The interface between the apparatus 50 and the DEK Model 265 screen printing machine will be described below.

The apparatus 50 includes two main parts. The first part is the pressure mechanism 60, which applies a downward force or pressure to the solder paste, and the second part is the printhead 65, which holds the solder paste.

The pressure mechanism 60 includes a piston crosshead 75 (FIG. 15) and position actuators 80 (FIG. 16) enclosed by a housing or cover 70. The piston actuators 80 drive the position crosshead 75 within the housing or cover 70 in an up and down direction substantially parallel to the side walls thereof shown by the arrows in FIG. 15. Piston actuators 80 preferably comprise double acting pneumatic cylinders which can be actuated in both the upward and downward directions. By regulating the air pressure to the piston actuators 80, a range of forces can be generated.

Figure 21:
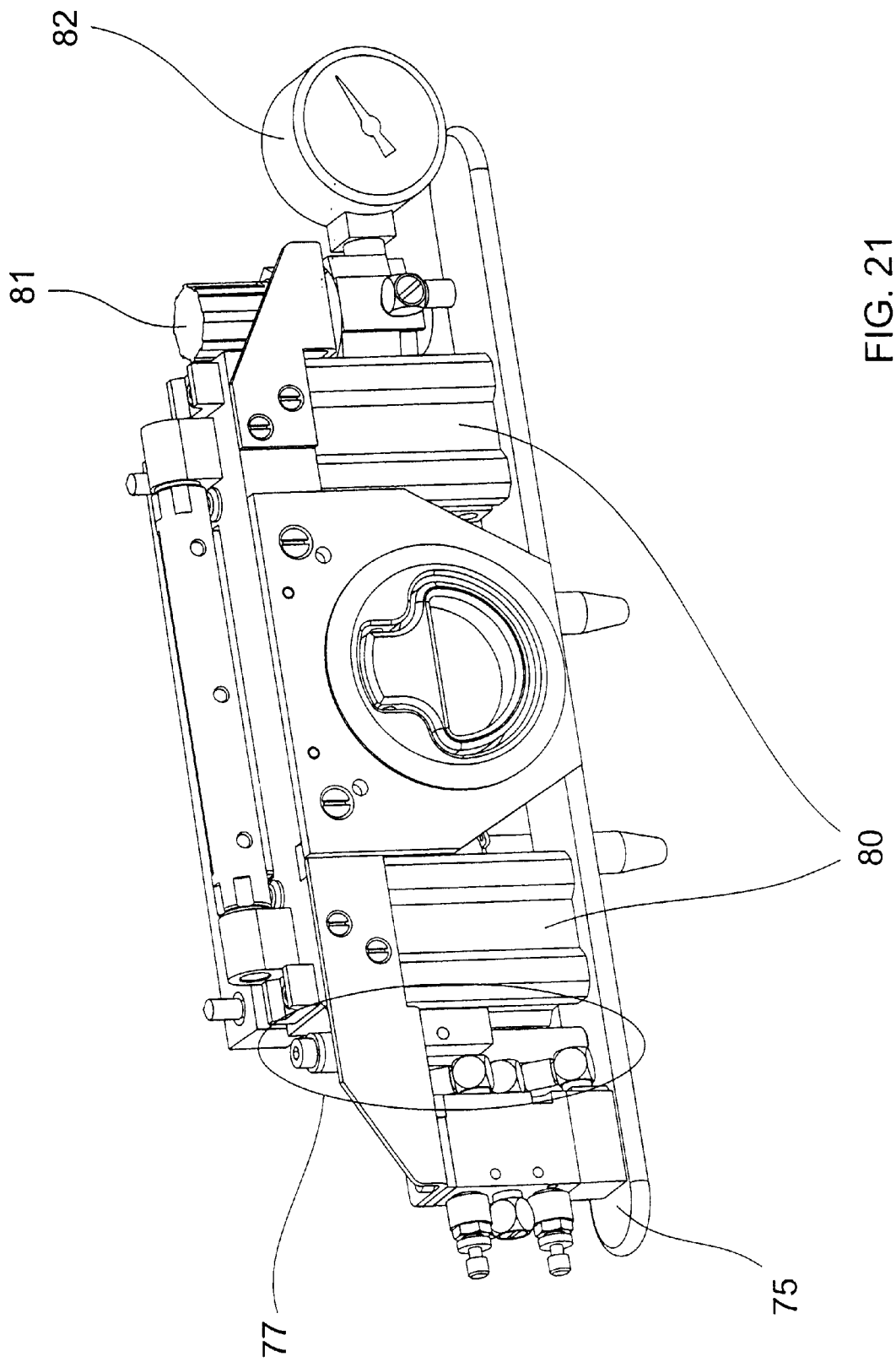
FIG. 21 is a perspective view of the pressure mechanism of the apparatus shown in FIGS. 14 through 18, where the cover is removed.

FIG. 21 is a front perspective view of the pressure mechanism 60 with housing or cover 70 removed. In the embodiment shown in FIG. 21, the pressure mechanism 60 includes pressure regulator 81 and pressure gauge 82 which allow for the manual adjustment and monitoring of the air pressure to the piston actuators 80. This regulation function can, however, also be accomplished automatically using software and an electronic regulator.

As shown in FIGS. 15 through 18, the pressure mechanism 60 is moveably attached to the printhead 65 by way of mounting assembly 83 and hinge 85. Thus, the pressure mechanism 60 is moveable between a closed position, shown in FIG. 14, and an open position, shown in FIGS. 15 through 18, by actuating the hinge 85. In addition, mounting assembly 83 includes rotary action latch 84 which enables the printhead 65 to be readily separated from the pressure mechanism 60 by a quarter turn thereof. This function allows the printhead 65 to be easily removed for long term storage, and also provides for easy interchangeability of multiple printheads with the same pressure mechanism 60 where, for example, each printhead contains a different type of solder material.

Figure 19:
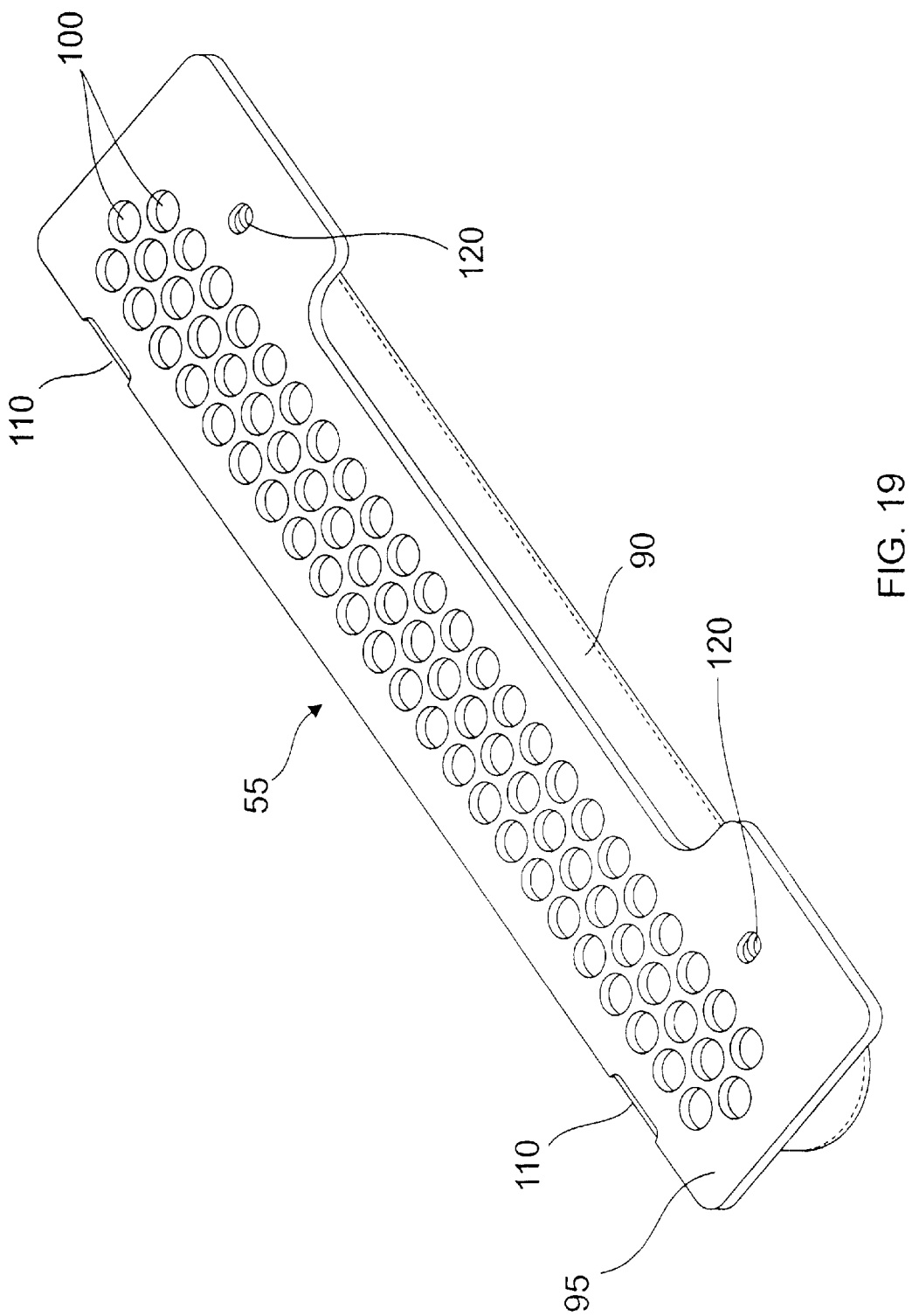
FIG. 19 is a perspective view of a commercially available embodiment of a paste cassette used in the apparatus of FIGS. 14 through 18.

Referring to FIG. 19, a perspective view of an embodiment of the paste cassette 55 is shown. The paste cassette 55 includes two main parts, a paste reservoir 90, which holds the solder paste, and a base 95. The paste reservoir 90 comprises a flexible case, preferably made of collapsible plastic, which is attached and sealed to the base 95. The base 95 is preferably made of a rigid material such as hard plastic and contains a plurality of apertures 100 through which the solder paste is able to pass. In a preferred embodiment, the apertures 100 are all of the same size and are made according to a constant spacing and pitch. The piston crosshead 75 is preferably made of a flat planar body the dimensions of which are substantially equal to the dimensions of the paste cassette 55, in particular the paste reservoir 95.

When sold, the base 95 and the apertures 100 are covered by a peelable strip, which is removed prior to insertion of the paste cassette 55 into the printhead 65 in the manner to be described below. The flexible nature of the paste reservoir 90 allows for an operator to knead the solder paste if the paste has been left for a long time or if any separation has occurred.

Figure 16:
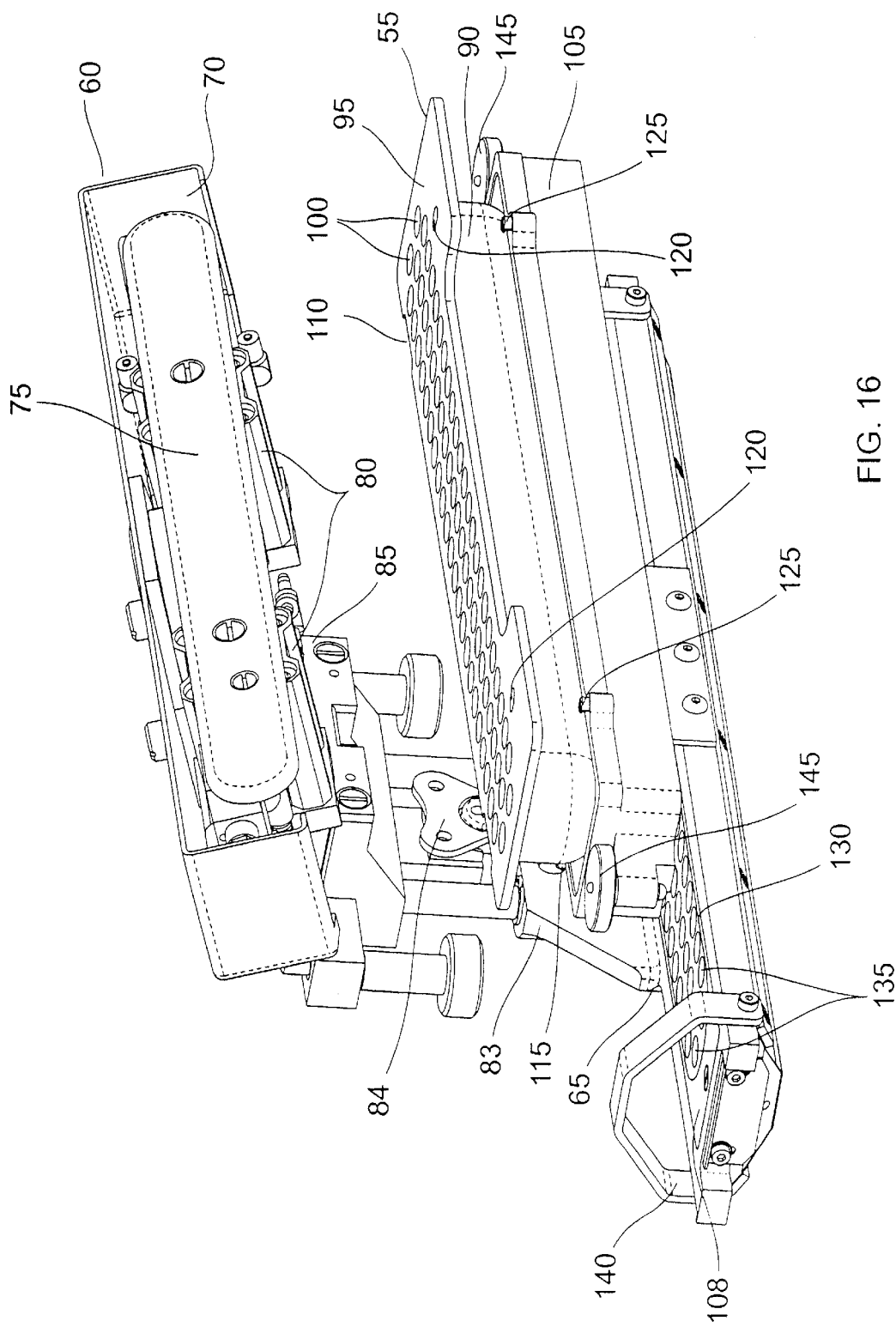
Figure 17:
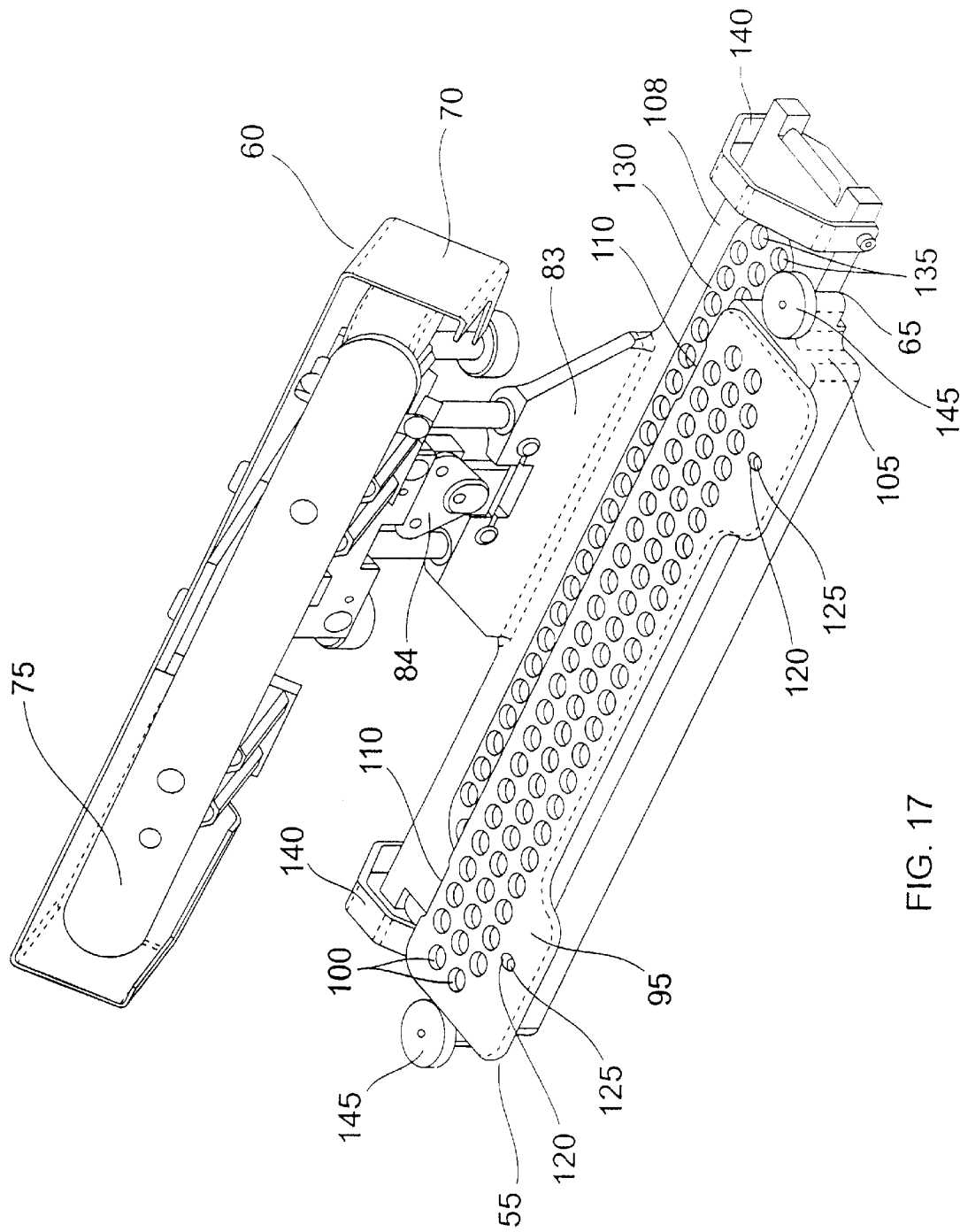

As shown in FIGS. 15 through 17, the paste cassette 55 is loaded into the printhead 65 by first inserting the paste cassette 55 into a carrier unit 105. Carrier unit 105 is attached to transfer head 108 by way of a hinge 109, the significance of which will be apparent below. The carrier unit 105 and the transfer head 108 are the two main parts that make up printhead 65. In order to secure paste cassette 55 to carrier unit 105, indentations 110 formed in base 95 slide under cassette retaining springs 115, and apertures 120 formed in base 95 fit over cassette retaining pins 125. Both cassette retaining springs 115 and cassette retaining pins 125 are attached to carrier unit 105.

Figure 18:
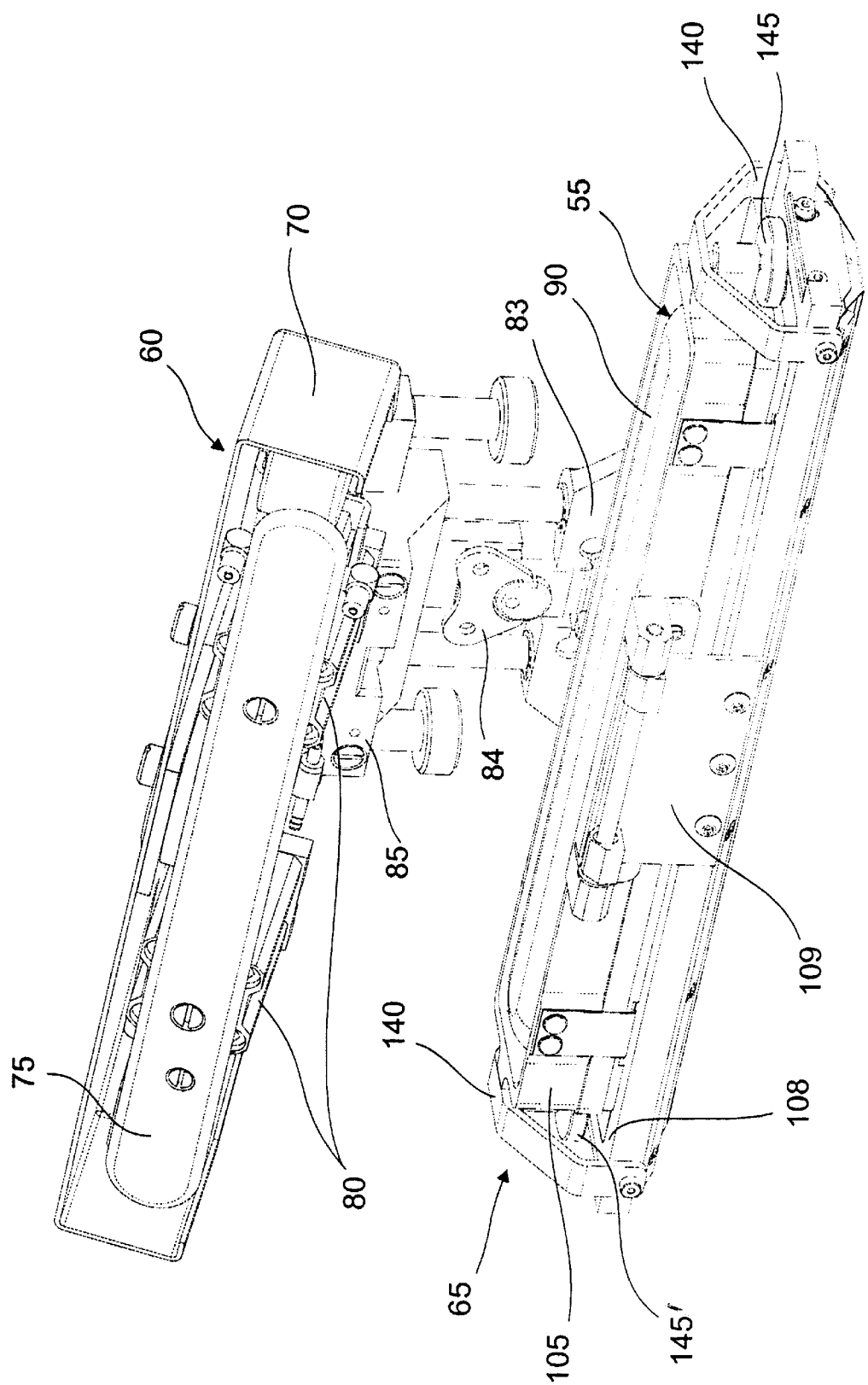

Carrier unit 105 can thus be moved from an open position, shown in FIGS. 15 through 17, to a closed position, shown in FIG. 18, by rotating carrier unit 105 on hinge 109. In the closed position, base 95 of the paste cassette 55 is in direct contact with the top side of transfer head 108. In particular, the transfer head 108 contains on the top side thereof a grid 130 having a plurality of apertures 135 which are sized and spaced such that they directly align with the apertures 100 formed in base 95 when the carrier unit 105 is in the closed position. The transfer head 108 includes clamp brackets 140 rotatably attached thereto. Thus, the carrier unit 105 containing the paste cassette 55 is able to be secured in place in the closed position by rotating the clamp brackets 140 over the longitudinal end portions of the carrier unit 105 and by tightening thumbscrews 145 affixed to the longitudinal end portions of the carrier unit 105 into bracket dimples on the undersides of the claim brackets 140. As can be seen from the above description, no tools are required during any of the stages of fitting the paste cassette 55 into the printhead 65. Once the paste cassette 55 is securely fitted into the printhead 65, the pressure mechanism 60 can be moved down into the closed position as described above; the apparatus 50 is then in a condition suitable to commence printing in a manner to be described below.

Referring to FIG. 14, the underside of transfer head 108 can be seen which includes wipers 150, end retainers 160, and grid 170. Wipers 150 are affixed to transfer head 108 by retaining strip 151, preferably made of metal, and screws 152. Similarly, end retainers 160 are affixed to transfer head 108 by retainer brackets 153, also preferably made of metal, and screws 154. Preferably, wipers 150 are made of polyester and end retainers 160 are made of silicone. Alternatively, the wipers 150 can be made of metal or a composite of metal and polyester. In addition, it is possible to form the wipers 150 and the end retainers 160 as a single integral unit out of polyester or the like.

Thus, as will be described in greater detail below, the apparatus 50 can be displaced along the surface of a stencil placed over a printed circuit board with the pressure mechanism 60 in the closed position (FIG. 14) at the same time that the piston actuators 80 move the piston crosshead 75 in a downward direction thereby applying a downward pressure to the paste reservoir 90 of paste cassette 55. As a result, the solder paste will be forced through the apertures 100 in base 95, through the apertures 135 in the grid 130, and ultimately through the grid 170 and the aperture 190 delimited by the wipers 150 and the end retainers 160 and onto the stencil.

Figure 22:
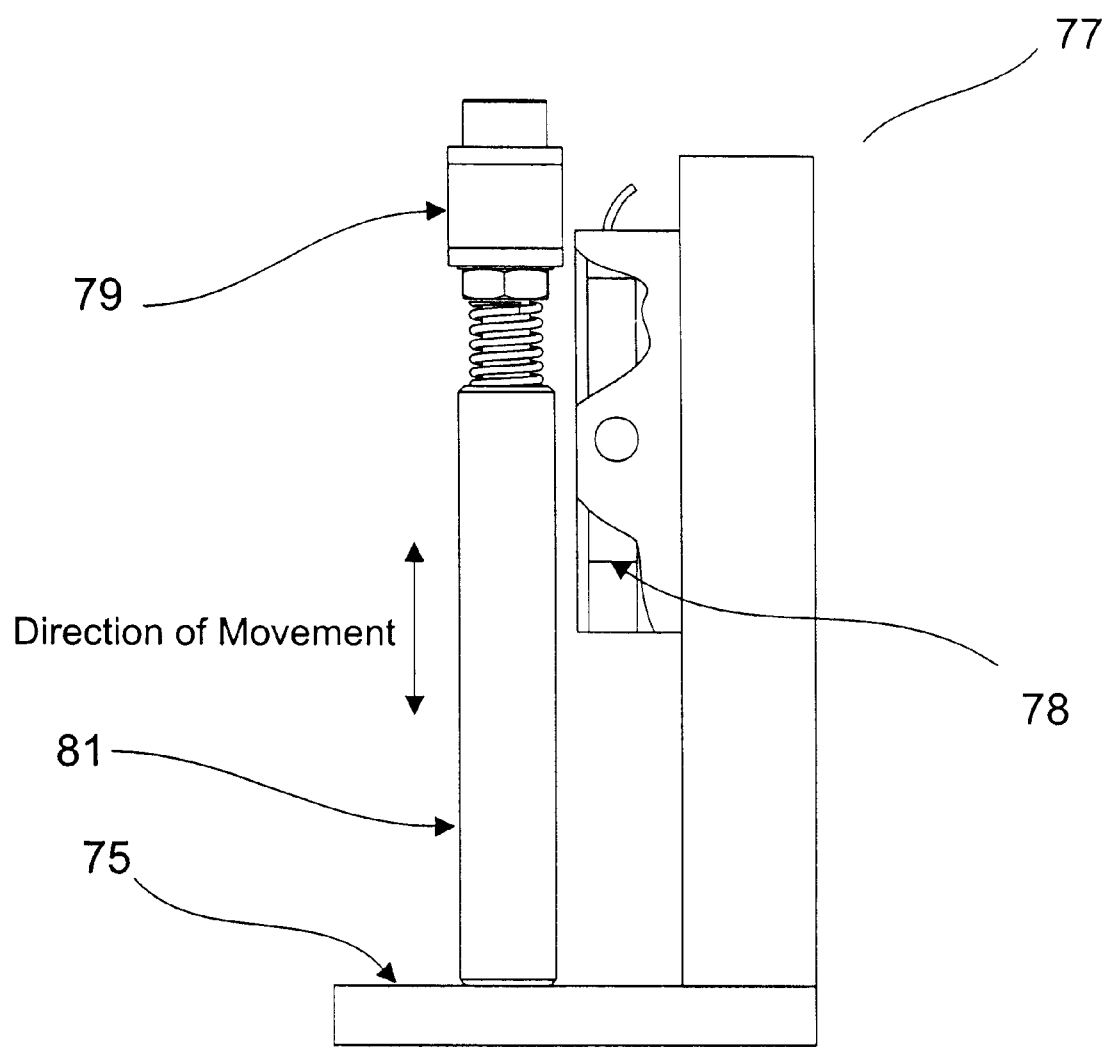
FIG. 22 is a diagram showing the sensor mechanism of the apparatus shown in FIGS. 14 through 18.

Referring to FIG. 21, cassette low sensor mechanism 77 is provided for detecting when the paste cassette 55 is empty. As shown in FIG. 22, the cassette low sensor mechanism 77 comprises a reed sensor 78 mounted adjacent to one of the piston actuators 80 and an adjustable magnet 79 mounted to piston crosshead 75 by a stand off 81. As the solder paste in the paste cassette 55 is used up, the stand off 81 and magnet 79 move down with the piston crosshead 75. The reed sensor 78 is enabled as the magnet 79 comes in close proximity therewith. The length of the stand off 81 and the magnet adjustment are set so that the magnet 79 will enable the reed sensor 78 when the piston crosshead 75 reaches the base 95 of the paste cassette 55, i.e., when the paste cassette 55 is empty.

Figure 23:
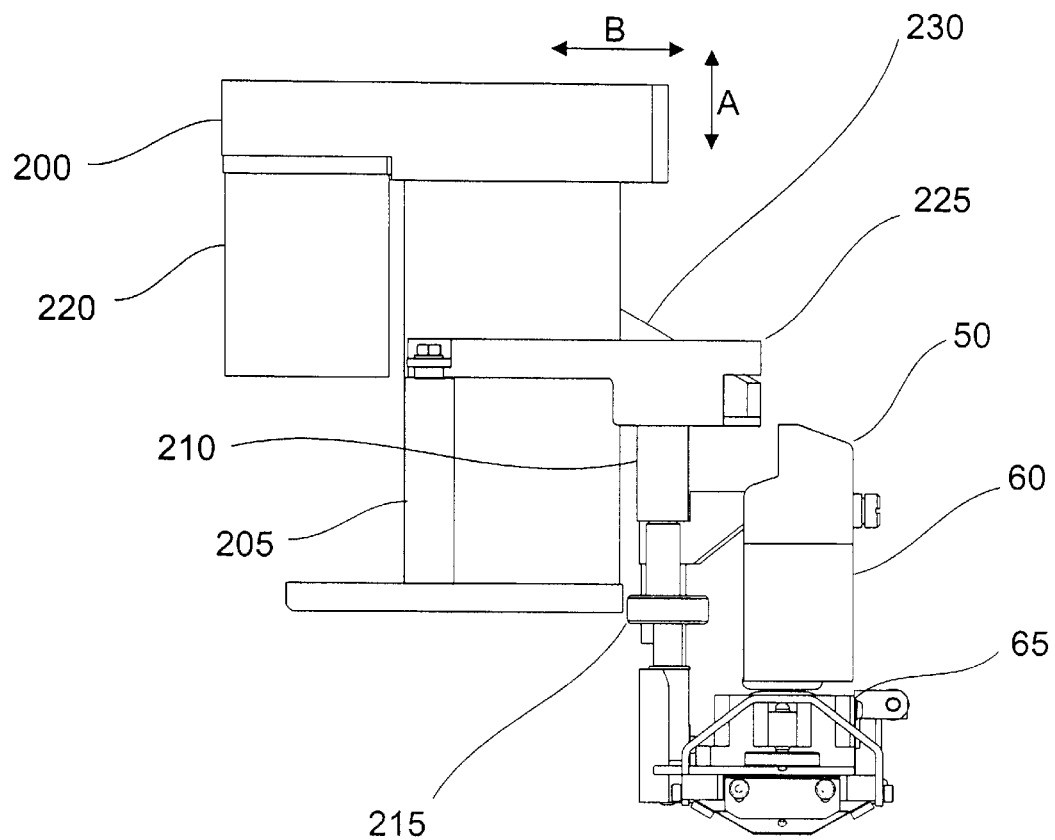
FIG. 23 is a diagram illustrating the interface between the apparatus shown in FIGS. 14 through 18 and a DEK Model 265 screen printing machine.

The details of how the apparatus 50 is interfaced with and mounted to an existing DEK Model 265 screen printing machine will now be described with reference to FIG. 23. FIG. 23 is a side view of the squeegee mechanism 200 and machine print carriage 205 of a DEK Model 265 screen printing machine having apparatus 50 mounted thereon. In particular, the pressure mechanism 60 is fixed to the rear squeegee mounting plate 210 of the squeegee mechanism 200 by two thumbscrew securing bolts 215, one on each longitudinal side of the apparatus 50.

The apparatus 50 is moveable in both the vertical direction, shown by arrow A, and the horizontal direction, shown by arrow B. The vertical movement is driven by the squeegee motors 220 of the DEK Model 265 screen printing machine and raises and lowers the apparatus 50 on and off the stencil and substrate. The horizontal movement is driven by the machine printhead motors (not shown) of the DEK Model 265 screen printing machine and moves the apparatus 50 across the stencil in both a forward and reverse direction. As will be discussed in more detail below, a print cycle may consist of single movement in either the forward or reverse direction. As shown in FIG. 23, a downstop 225 is fixed to the front squeegee mounting plate 230 of the DEK Model 265 screen printing machine. The purpose of the downstop 225 is to provide the apparatus 50 with a zero pressure datum when the apparatus 50 is at what is called the contact height with the stencil.

Figure 24:
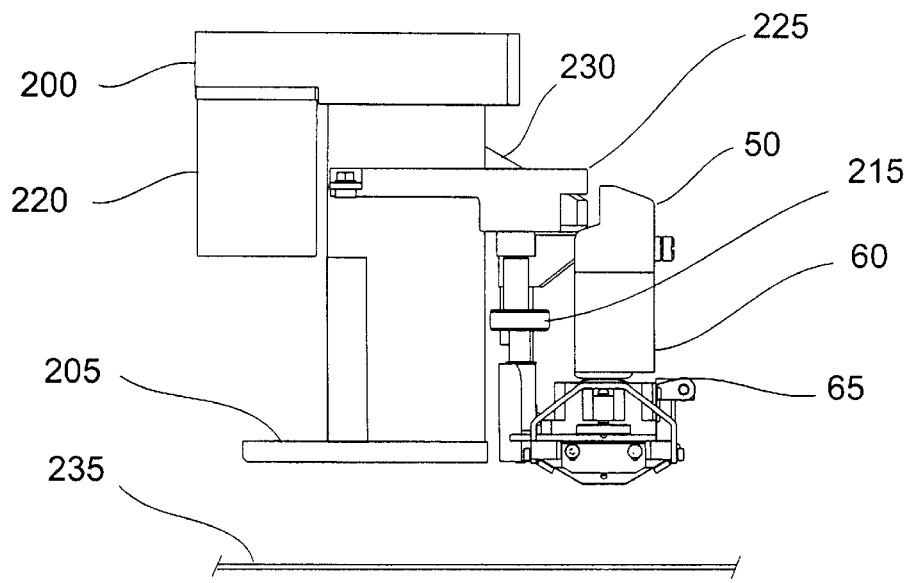
FIG. 24 is a diagram showing the apparatus shown in FIGS. 14 through 18 attached to a DEK Model 265 screen printing machine, wherein the apparatus is in the fully raised vertical position.
Figure 25:
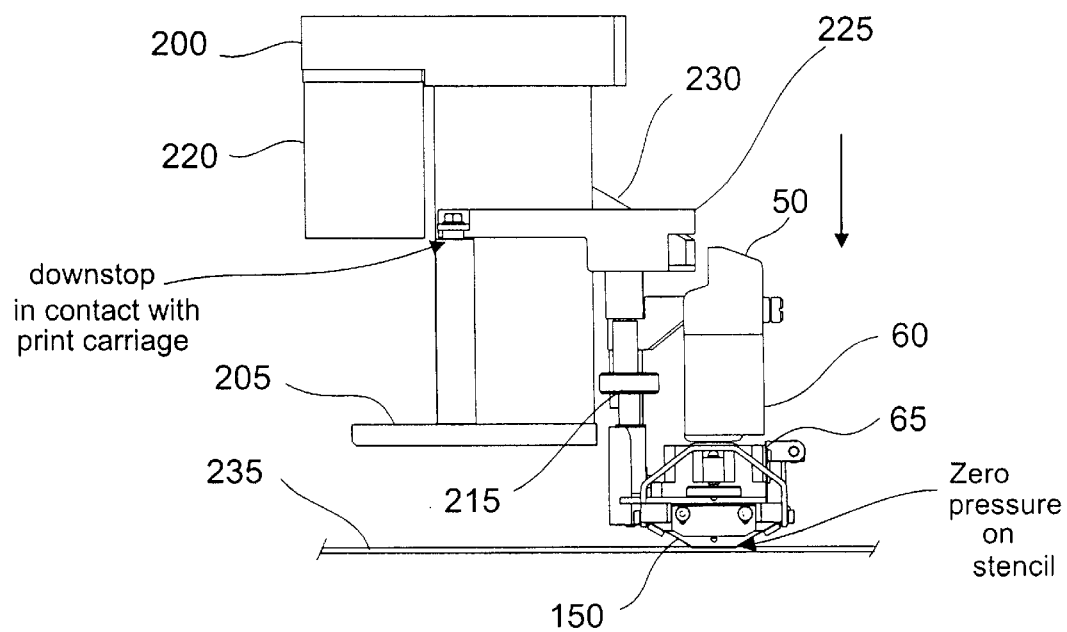
FIG. 25 is a diagram showing the apparatus shown in FIGS. 14 through 18 attached to a DEK Model 265 screen printing machine, wherein the apparatus is at the contact height.

Referring to FIGS. 24 and 25, the apparatus 50 has two vertically positioned configurations. The first configuration is the home position and is shown in FIG. 24. The second configuration is the contact height discussed above and is shown in FIG. 25. In the home position, the apparatus 50 is fully raised. The apparatus 50 is moved to the home position during initialization, power up, exiting diagnostics and when power is restored following a system power down. Contact height is the position at which the wipers 150 of the apparatus 50 are just in contact with the stencil, shown as item 235 in FIG. 25, but with no downward force exerted (zero pressure). As shown in FIG. 25, at the contact height the downstop 225 engages the print carriage 205.

The sequence of a typical print cycle in which solder paste is applied to the surface of a printed circuit board through the apertures in a stencil will now be described in connection with FIGS. 26 and 27. The apparatus 50 is designed to be a single bi-directional printing device, and thus there is no requirement to carry out any vertical movements at the end of each print cycle.

At the start of the print cycle, the apparatus 50 is lowered to the contact height onto the stencil 235 (zero pressure). As shown in FIG. 26, the print carriage 205 is positioned so that when the apparatus 50 is lowered to the contact height it is centered over one of the rails 240 of the printing machine. Rails 240 are used to transport the printed circuit boards 245 within the printing machine and typically include a belt and pulley system coupled to a support structure. The rail 240 thus provides support for the apparatus 50.

Figure 26:
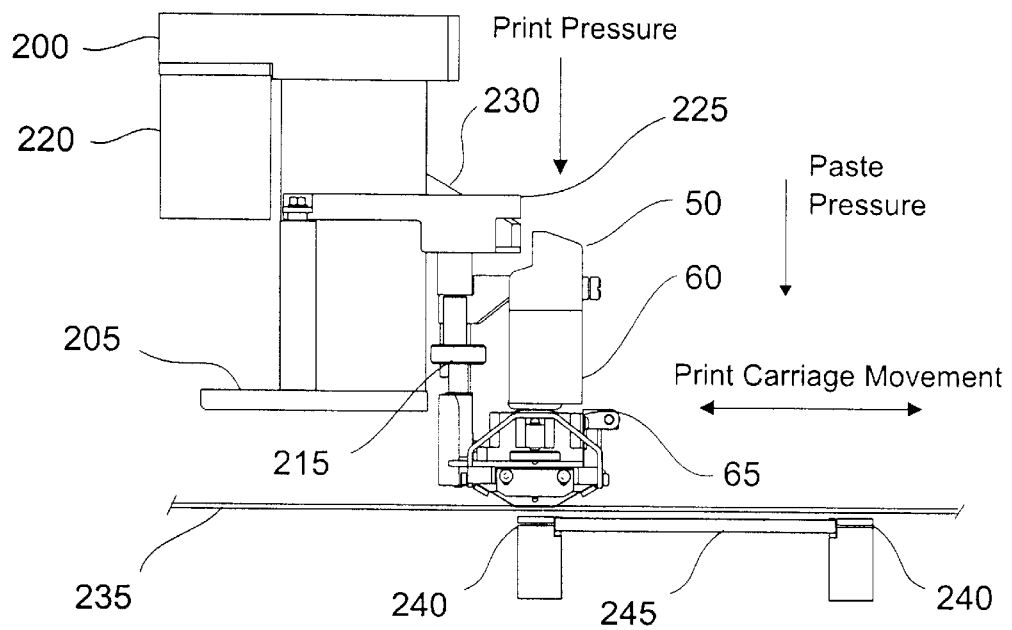
FIGS. 26 and 27 are diagrams illustrating a print cycle utilizing the apparatus shown in FIGS. 14 through 18 attached to a DEK Model 265 screen printing machine.

Next, a downward print pressure, designated by the arrow in FIG. 26, is applied to the apparatus 50 by the squeegee motors 220 prior to the print carriage 205 commencing the horizontal print stroke as described below. This downward print pressure causes a gasketing to occur between the wipers 150 and end retainers 160 and the stencil 235. A downward print pressure force of between 8–10 kilograms is found to be suitable for a 300 mm size apparatus 50.

Next, a downward paste pressure, shown by the arrow in FIG. 26, of between 2.5 and 3 Bar is applied by the piston actuators 80, resulting in a force being applied by the piston crosshead 75 to the solder paste in the paste cassette 55. As a result, the wipers 150 are pushed against the stencil 235. Then, by operation of the machine print head motors (not shown), the print carriage 205, and consequently the apparatus 50, performs a print stroke by moving horizontally along the stencil 235 and the printed circuit board 245 in the direction shown by the arrow in FIG. 26. Suitable print stroke speeds are between 110 and 150 mm/sec.

Figure 27:
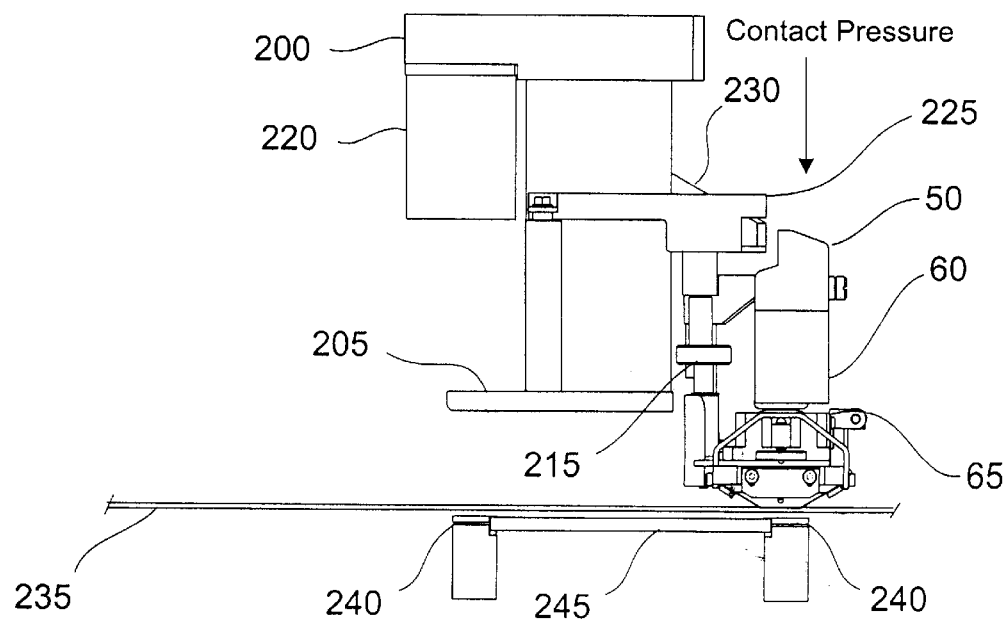

As shown in FIG. 27, the print carriage 205 stops at a position centered over the opposite rail 240, ensuring that the apparatus 50 is well supported while under the print pressure. The paste pressure of the piston actuators 80 is removed as soon as the print carriage 205 has stopped moving. Then, the print pressure is removed and, as a result, the apparatus 50 returns to contact height. The apparatus 50 is now ready to apply solder paste to the surface of the next printed circuit board 245, moved into position by the rails 240, through the apertures of the stencil 235 by repeating the above sequence while travelling in the opposite direction.

Figure 1:
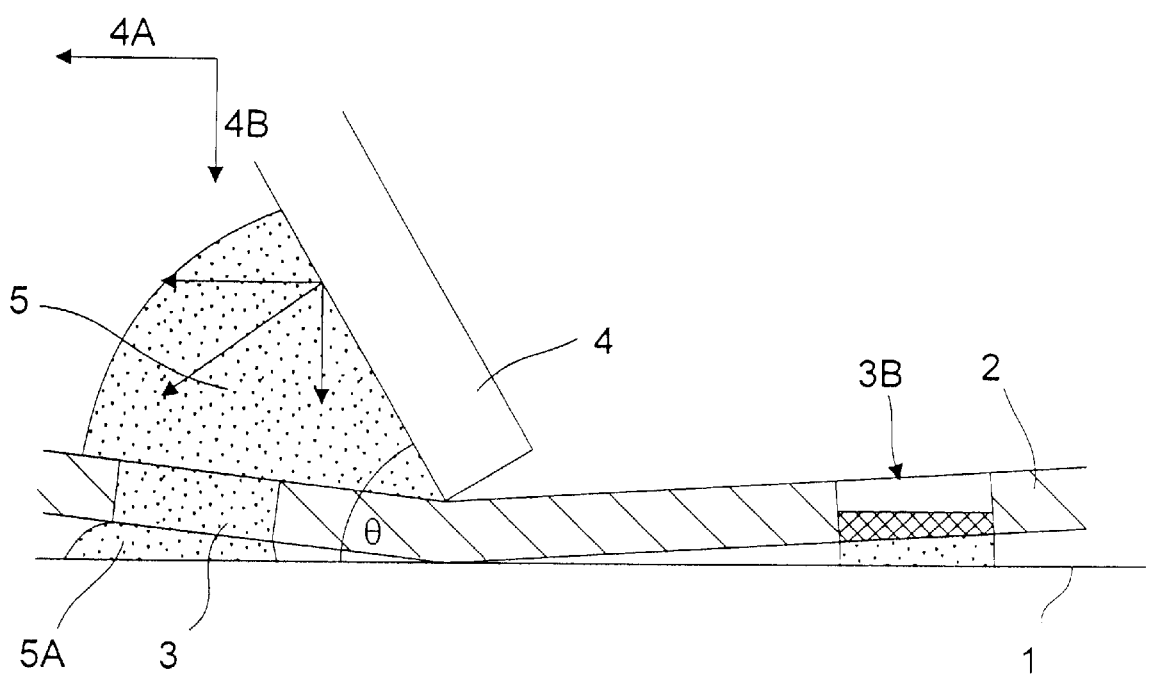
FIG. 1 schematically shows an operation of deposition of a paste-like or viscous material by screen printing according to the prior art.
Figure 20:
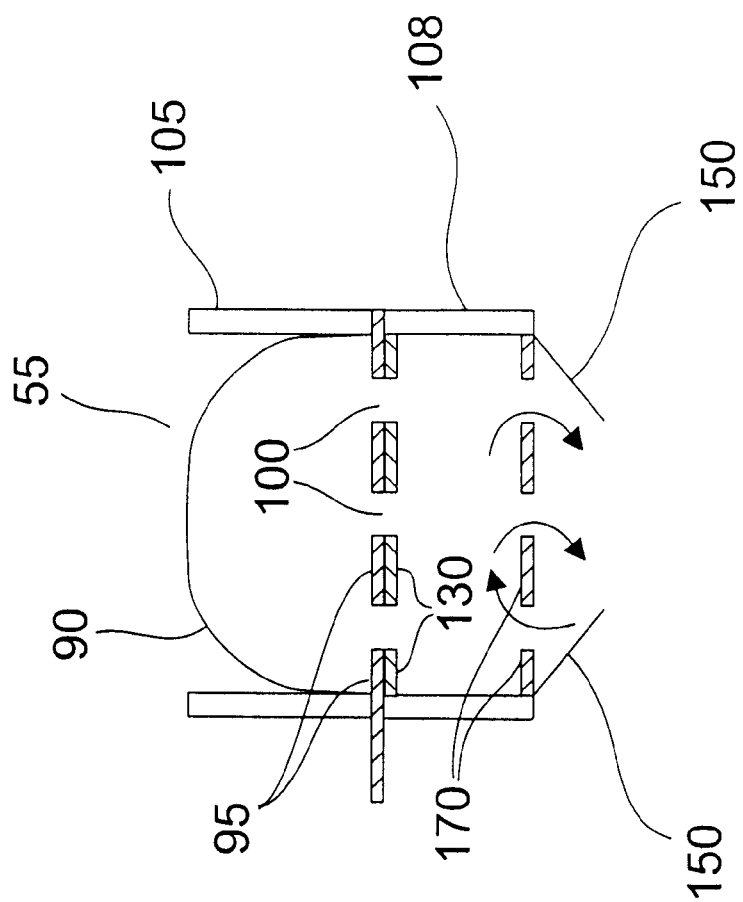
FIG. 20 is a cross sectional view of the printhead in FIGS. 14 through 18.

During the print cycle just described, as the apparatus 50 is moved back and forth along the stencil 235, the wipers 150 constantly detach and lift any excess solder paste which remains in the zone delimited by the grid 170, the wipers 150 and the end retainers 160. As a result, solder paste waste is eliminated and solder paste is not left on the stencil 235 to dry. Furthermore, as shown in FIG. 20, as the excess solder paste is detached and lifted, it is constantly passed up through the grid 170 and back down through the grid 170 as shown by the rotational arrows. Thus, the solder paste is constantly rotated and homogenized which results in the solder paste having proper rheological qualities. Also, during the print cycle, the solder paste is contained within the airtight zone delimited by the grid 170, the wipers 150 and the end retainers 160, thereby preventing the formation of "tram-lines" that resulted in the prior art systems and preventing evaporation of the solvents from the paste. Furthermore, as the apparatus 50 moves along the stencil 235, the solder paste is always behind a point of contact between one of the wipers 150 (the forward most wiper) and the stencil 235 which prevents the solder paste from passing under the stencil 235 and smearing as is shown in FIG. 1.

In addition, as is evident from the above description, the lateral force used to move the apparatus 50 along the stencil 235 and the downward force applied to the solder paste in the transfer head 65 are, unlike in prior art squeegee systems, completely independent from one another. Thus, the speed of the apparatus is not related to the pressure applied to the solder paste, the result being the ability to print at a greater speed. Also, contact time T and pressure P, which as described above are related to transfer efficiency, can be independently controlled. Furthermore, because the apparatus 50 is a closed system, i.e., the solder paste is contained within the airtight zone delimited by the grid 170, the wipers 150 and the end retainers 160, the viscosity V of the solder paste can be controlled. As a result, the transfer efficiency of apparatus 50, characterized by the coefficient $$K = \frac{T \times P}{V},$$

can be controlled.

Figure 28:
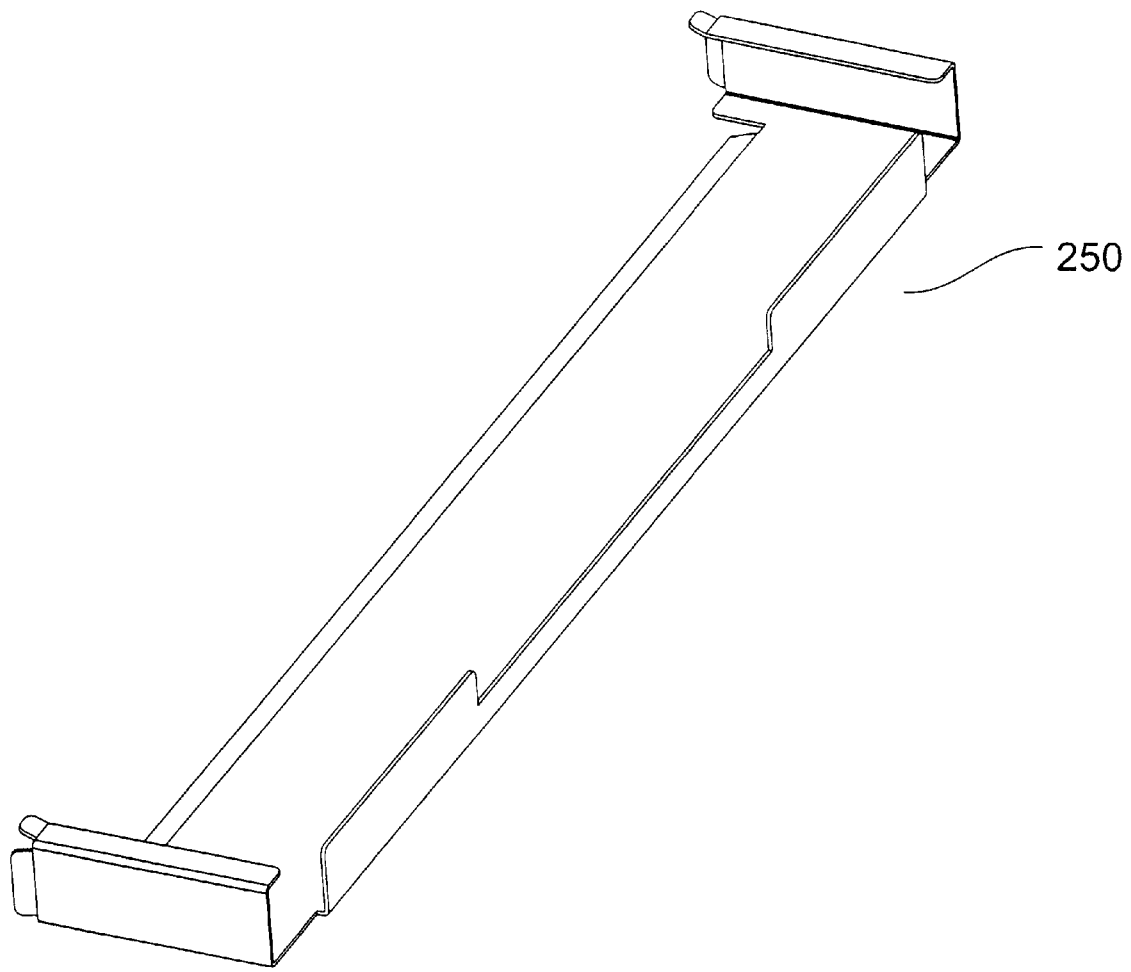
FIG. 28 is a perspective view of a paste cover to be used in conjunction with the apparatus shown in FIGS. 14 through 18.

FIG. 28 is a perspective view of a paste cover 250 which is adapted to fit over the bottom of the transfer head 108 when the apparatus 50 is not in use. The paste cover thus prevents the solder paste in the paste cassette 55 from being exposed to the air.

Through use and continued research, it has been discovered that when the intermediate receptacle 23 and the cassette 55 described above are used, it is often the case that a significant amount of solder paste is left unused inside the receptacle 23 and/or the cassette 55 and is thus wasted. In the case of the intermediate receptacle 23, due to the flat planar nature of the cover 24, a significant portion of the solder paste is not able to be pushed through the grille 17. Similarly, in the case of the cassette 55, when the flexible case of the paste reservoir 90 is collapsed by the action of the piston crosshead 75, a significant portion of the solder paste is not able to be pushed through the apertures 100 formed in the base 95.

Figure 29:
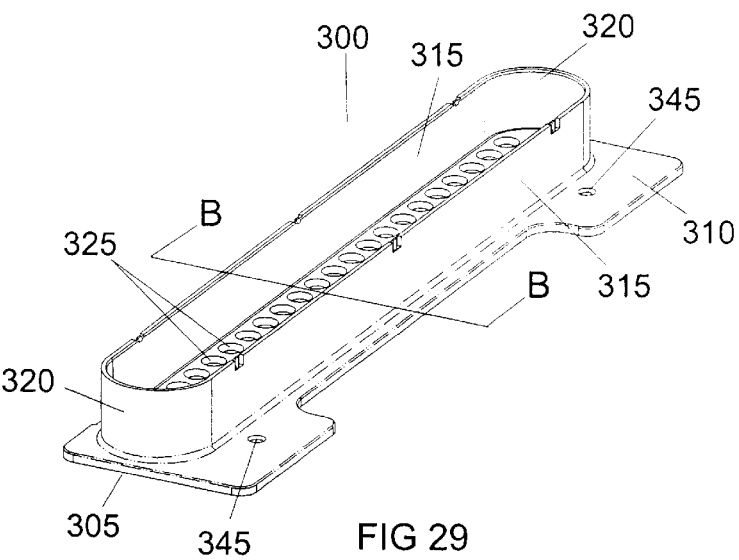
FIG. 29 is a perspective view of an embodiment of a cassette for holding and dispensing a viscous material according to an aspect of the present invention.
Figure 30:
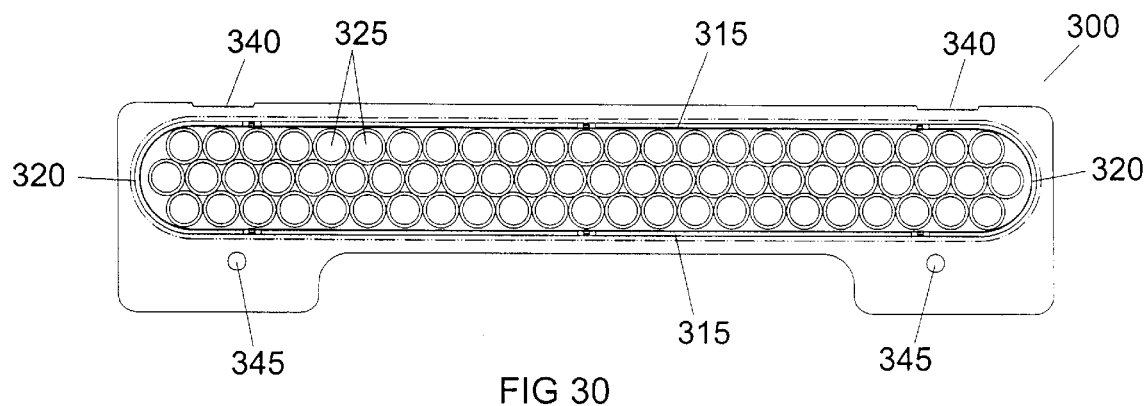
FIGS. 30 and 31 are top and bottom views, respectively, of the cassette shown in FIG. 29.
Figure 31:
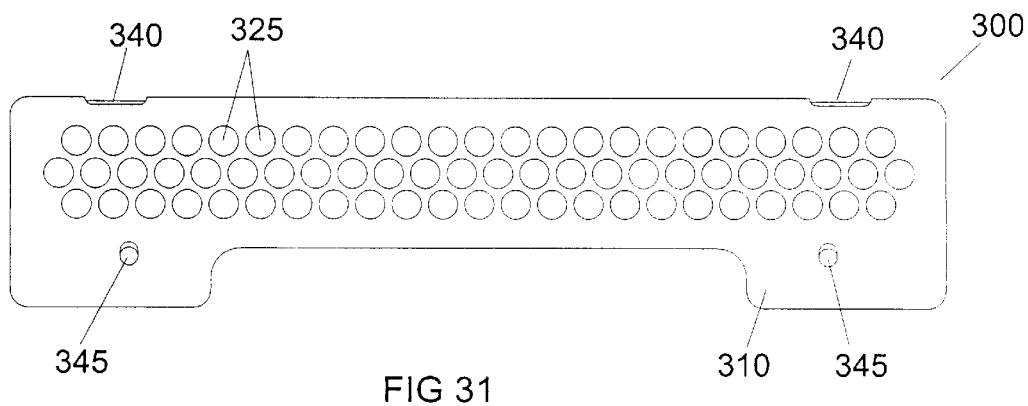

In order to solve these problems associated with intermediate receptacle 23 and cassette 55, an alternative embodiment of a cassette for holding and dispensing a viscous material for use in an apparatus for depositing the viscous material on a substrate according to the present invention is provided. A perspective view of this alternative embodiment, minus the cover plate 330 to be described below, is shown in FIG. 29 and is indicated generally by reference numeral 300. FIGS. 30 and 31 are top and bottom views, respectively, of cassette 300 shown in FIG. 29.

Cassette 300 includes body 305 preferably made of a moldable and recyclable rigid synthetic material such as hard plastic, loaded nylon or 30% talc-fill polypropylene. Body 305 includes base section 310 having substantially orthoganol side walls 315 and end walls 320 attached thereto. The body 305 of cassette 300 thus has a substantially constant cross-sectional shape, meaning it has a constant cross-section from top to bottom. As a result, the pressure being applied to the viscous material contained in the cassette 300, in the manner to be described below, will be substantially constant throughout the interior of the cassette 300. In a preferred embodiment, body 305, made up of base section 310, side walls 315 and end walls 320, is molded from a single piece of plastic. Base section 310 includes a plurality of apertures 325 through which solder paste is able to pass.

Figure 32:
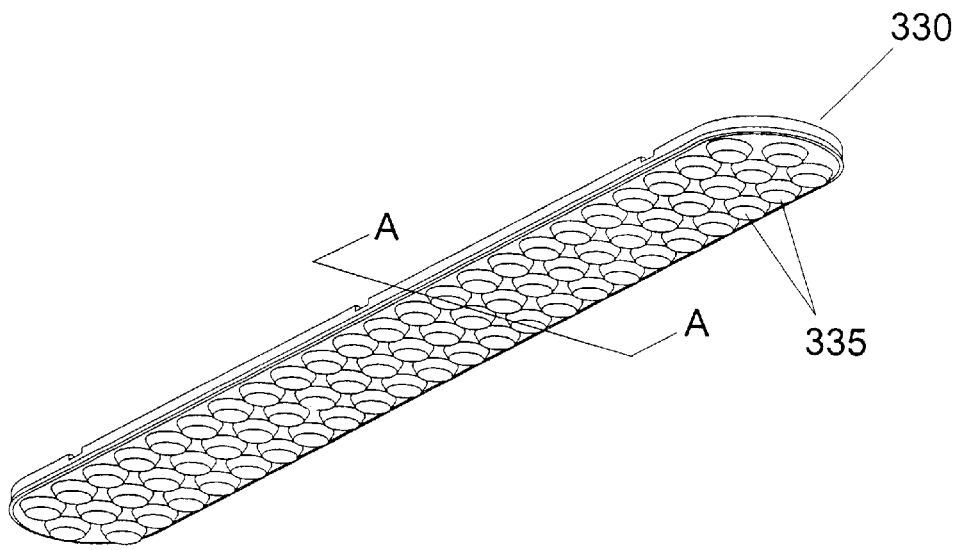
FIG. 32 is a bottom perspective view of a cover plate or piston according to an aspect of the present invention for use in connection with the cassette shown in FIGS. 29, 30 and 31.
Figure 33:
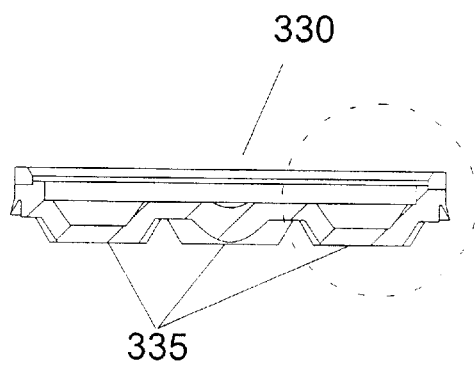
FIG. 33 is a cross-sectional view of the cover plate shown in FIG. 32 taken along lines A—A of FIG. 32.
Figure 34:
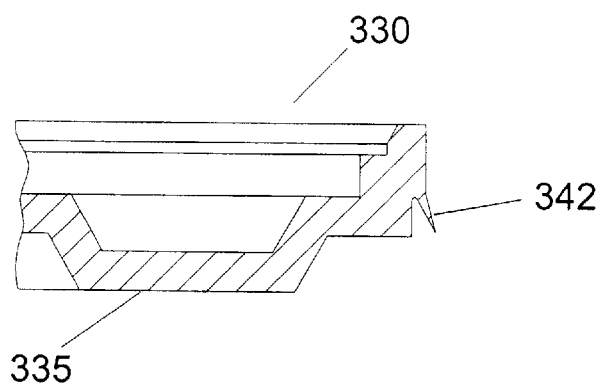
FIG. 34 is an exploded cross-sectional view of a portion of the cover plate shown in FIG. 33 indicated by the broken lines in FIG. 33.

Referring to FIG. 32, cassette 300 is provided with cover plate 330, also referred to as a piston, preferably made of the same material as body 305. The cover plate 330 has dimensions slightly smaller than the opening formed in the top of body 305 by the side walls 315 and the end walls 320. Thus, the cover plate 330 is able to rest on the viscous material provided within body 305 and is able to slide within the body 305 when a downward pressure is exerted thereon. FIG. 33 is a cross-sectional view of cover plate 330 taken along lines A—A of FIG. 32. As can be seen in FIGS. 32 and 33, cover plate 330 includes a plurality of protruding members 335. Protruding members 335 are arranged so as to be aligned with apertures 325 formed in base section 310 when cover plate 330 is inserted into body 305. Furthermore, protruding members 335 are preferably shaped so as to match the shape of apertures 325 and are sized to fit within the apertures 325. It should be understood, however, that protruding members 335 could also be of a different shape than apertures 325 as long as the protruding members 335 are sized to fit within the apertures 325. For example, aperture 325 could have a square shape and protruding members 335 could have a circular shape sized to fit with the apertures 325. Referring to FIG. 34, an exploded cross-sectional view of a portion of cover plate 330 indicated by broken lines in FIG. 33 is shown. As can be seen in FIG. 34, cover plate 330 includes integrally molded sealing lip 342 along the top outer edge thereof. Sealing lip 342 is included in order to provide a seal between the cover plate 330 and the interior of the body 305 as the cover plate 330 slides within the body 305. As will be appreciated by one of skill in the art, other ways of providing a seal between cover plate 330 and the interior of body 305 are possible, such as gasketing ring provided on the top outer edge of cover plate 330.

The cassette 300 as just described is adapted to be readily loadable into the carrier unit 105 of the printhead 65 of the apparatus 50 described herein. Accordingly, cassette 300 is provided with indentations 340 in the base section 310 thereof which slide under cassette retaining springs 115 of carrier unit 105, and apertures 345 in the base section thereof which fit over cassette retaining pins 125 of carrier unit 105. As such, the cassette 300 can be readily substituted for the cassette 55 shown in FIGS. 15 through 19.

In a preferred embodiment of the cassette 300, body 305 and cover plate 330 are made of 30% talc-fill polypropylene, body 305 is 310 mm long, 70 mm wide and 29.3 mm high, and body 305 holds approximately 196 cc of solder paste.

Figure 35:
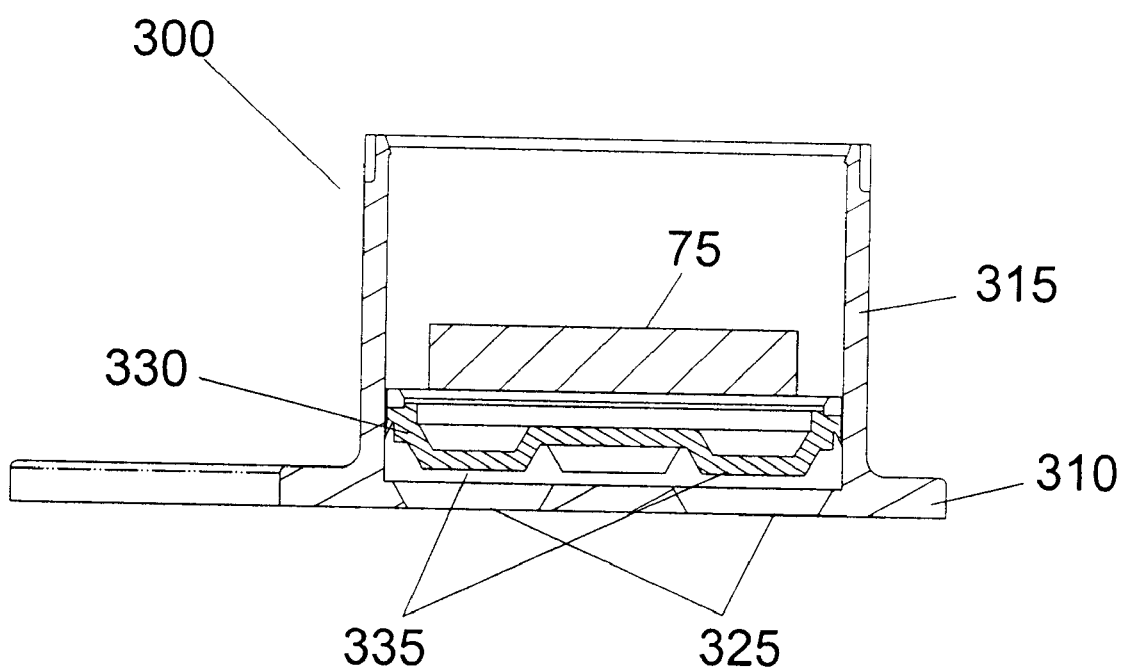
FIG. 35 is a cross-sectional view of the cassette shown in FIGS. 29, 30 and 31 having the cover plate shown in FIG. 32 inserted therein taken along lines B—B of FIG. 29.

In operation, after the cassette 300 is loaded in carrier unit 105, the apparatus 50 can be displaced along the surface of a stencil placed over a printed circuit board with the pressure mechanism 60 in the closed position at the same time that the piston actuators 80 move the piston crosshead 75 in a downward direction, thereby applying a downward pressure to the cover plate 330 of the cassette 300. As a result, the solder paste will be forced through the apertures 325 in base section 310, through the apertures 135 in the grid 130, and ultimately through the grid 170 and the aperture 190 delimited by the wipers 150 and end retainers 160 and onto the stencil. When the cassette 300 is nearly empty and the cover plate 330 reaches the bottom of body 305, the protruding members 335 will be aligned with, and ultimately inserted into, the apertures 325 of the base section 310. As a result, a maximum amount of solder paste will be forced out of cassette 300, and waste of solder paste due to residual paste in an exhausted cassette 300 will be minimized. FIG. 35 is a cross-sectional view of cassette 300 having cover plate 330 inserted therein taken along lines B—B of FIG. 29 which also shows piston crosshead 75 applying a downward pressure to cover plate 330.

One skilled in the art will appreciate that the present invention can be practiced by other than the described embodiments, which are presented for purposes of illustration and not of limitation.

We claim:

1. A cassette for holding and dispensing a viscous material for use in an apparatus for depositing the viscous material onto a substrate through openings formed in a stencil positioned over the substrate, comprising:
    a body having a base and an interior defined by first and second side walls and first and second end walls substantially orthoganol to said base, said base having a plurality of apertures formed therein; and
    a cover plate adapted to slide within said interior of said body, said cover plate having a plurality of protruding members, wherein each of said protruding members corresponds and is aligned with a corresponding one of said apertures.

2. An apparatus according to claim 1, wherein said body has a constant cross-sectional shape.

3. An apparatus according to claim 1, wherein said apertures and said protruding members share a common shape and said protruding members are sized to fit within said apertures.

4. An apparatus according to claim 3, wherein said common shape is circular.

5. An apparatus according to claim 1, wherein said protruding members are of a size and shape that fit within said apertures.

6. An apparatus according to claim 5, wherein said apertures and said protruding members are of a different shape.

7. An apparatus according to claim 1, wherein said cover plate further comprises means for providing a seal between said cover plate and said interior of said body.

8. An apparatus for depositing a viscous material on a substrate through the apertures of a stencil, comprising:
    a cassette for holding and dispensing said viscous material, said cassette having a body having a base and an interior defined by first and second side walls and first and second end walls substantially orthoganol to said base, said base having a plurality of apertures formed therein, and a cover plate adapted to slide within said interior of said body, said cover plate having a plurality of protruding members, wherein each of said protruding members corresponds to and is aligned with a corresponding one of said apertures of said base;
    a transfer head having a plurality of apertures on a top side thereof;
    a carrier unit adapted to receive said cassette, said carrier unit being affixed to said transfer head by a hinge such that said carrier unit is moveable between an open position and a closed position, wherein when said cassette is loaded into said carrier unit and when said carrier unit is in said closed position, said apertures of said base of said cassette are aligned with said apertures of said transfer head;
    first and second wipers attached to a bottom side of said transfer head at first and second longitudinal sides thereof; and
    a piston crosshead for applying a pressure to said cover plate when said carrier unit is in said closed position.

9. An apparatus according to claim 8, wherein said body has a constant cross-sectional shape.

10. An apparatus according to claim 8, further comprising a pneumatic cylinder for moving said piston crosshead in a direction substantially perpendicular to a plane defined by said top side of said transfer head.

11. An apparatus according to claim 10, further comprising a cover enclosing said piston crosshead and said pneumatic cylinder.

12. An apparatus according to claim 11, wherein said cover, said piston crosshead and said pneumatic cylinder comprise a pressure mechanism, said pressure mechanism being affixed to said transfer head by a mounting assembly including a hinge such that said pressure mechanism is moveable between an open position and a closed position.

13. An apparatus according to claim 12, wherein said mounting assembly further comprises a rotary action latch which releasably connects said pressure mechanism to said transfer head.

14. An apparatus according to claim 12, wherein when said pressure mechanism is in said closed position, said piston crosshead is directly above and aligned with said cassette.

15. An apparatus according to claim 10, further comprising a pressure gauge and a pressure regulator for regulating the air pressure supplied to said pneumatic cylinder.

16. An apparatus according to claim 8, wherein said base of said cassette includes an indentation and an aperture, wherein said carrier unit includes a retaining spring and a retaining pin, and wherein when said cassette is loaded into said carrier unit said indentation fits under said retaining spring and said retaining pin fits into said aperture.

17. An apparatus according to claim 8, wherein when said piston crosshead applies a pressure to said cover plate, said viscous material is pushed through said apertures of said base of the cassette and said apertures of said transfer head and against said first and second wipers, and said first and second wipers are pushed against the stencil.

18. An apparatus according to claim 8, wherein said first and second longitudinal sides of said transfer head are connected by first and second transverse sides, said apparatus further comprising end retainers attached to said first and second transverse sides.

19. An apparatus according to claim 8, further comprising a grid having a plurality of apertures attached to said bottom side of said transfer head.

20. An apparatus according to claim 19, wherein when said apparatus is displaced along the stencil, an excess amount of said viscous material left on the stencil is detached and lifted by said first wiper and rolled in an area delimited by said first and second wipers.

21. An apparatus according to claim 20, wherein when said excess amount of said viscous material is detached and lifted and rolled, said excess amount of said viscous material is pushed up through said grid.

22. An apparatus according to claim 8, further comprising means for securing said carrier unit in place in said closed position.

23. An apparatus according to claim 8, further comprising means for sensing when said cassette is empty.

24. An apparatus according to claim 8, further comprising means for moving said apparatus back and forth over the stencil in a first direction substantially parallel to a surface of the stencil.

25. An apparatus according to claim 24, further comprising means for moving said apparatus in a second direction substantially perpendicular to said first direction.

26. An apparatus for depositing a viscous material onto a substrate through openings formed in a stencil positioned over the substrate, comprising:

a receptacle having a top and a bottom, and first and second longitudinal sides opposite one another, said bottom having a plurality of apertures;

an intermediate receptacle containing said material inserted inside said receptacle, said intermediate receptacle having a body having a base and an interior defined by first and second side walls and first and second walls substantially orthoganol to said base, said base having a plurality of apertures formed therein, and a cover plate adapted to slide within said interior of said body, said cover plate having a plurality of protruding members, wherein each of said protruding members corresponds to and is aligned with a corresponding one of said apertures of said base;

a piston movable within said receptacle for applying a pressure to said cover plate to move said material toward said apertures of said base of said intermediate receptacle and toward said apertures of said receptacle; and a first wiper attached to said bottom of said receptacle at said first longitudinal side and a second wiper attached to said bottom of said receptacle at said second longitudinal side, wherein said first and second wipers are inclined at an angle with respect to a plane that is parallel to said bottom of said receptacle.

27. An apparatus according to claim 26, wherein said body has a constant cross-sectional shape.

28. An apparatus according to claim 26, wherein said angle is measured in a zone between said first wiper and said second wiper and is between 120° and 180°.

29. An apparatus according to claim 26, wherein when said apparatus is displaced along said stencil positioned over said substrate, an excess amount of said material left on said stencil is detached and lifted by said first wiper and is pushed through said apertures in said receptacle.

30. An apparatus according to claim 29, wherein said excess amount of material detached and lifted by said first wiper is rolled in an area between said first and second wipers.

* * * * *